(12) United States Patent
Sotoku et al.

(10) Patent No.: US 10,748,795 B2
(45) Date of Patent: Aug. 18, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventors: Kota Sotoku, Kyoto (JP); Toyohide Hayashi, Kyoto (JP); Akito Hatano, Kyoto (JP); Takayuki Gohara, Kyoto (JP); Hiroaki Takahashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 264 days.

(21) Appl. No.: 15/699,196

(22) Filed: Sep. 8, 2017

(65) Prior Publication Data

US 2018/0090352 A1 Mar. 29, 2018

(30) Foreign Application Priority Data

Sep. 26, 2016 (JP) ................................. 2016-187251

(51) Int. Cl.
| | |
|---|---|
| *H01L 21/67* | (2006.01) |
| *H01L 21/677* | (2006.01) |
| *H01L 21/687* | (2006.01) |

(52) U.S. Cl.
CPC .... *H01L 21/67167* (2013.01); *H01L 21/6719* (2013.01); *H01L 21/67109* (2013.01); *H01L 21/67178* (2013.01); *H01L 21/67196* (2013.01); *H01L 21/67207* (2013.01); *H01L 21/67748* (2013.01); *H01L 21/68742* (2013.01)

(58) Field of Classification Search
None
See application file for complete search history.

(56) References Cited

U.S. PATENT DOCUMENTS

| | | | |
|---|---|---|---|
| 6,402,400 B1 | 6/2002 | Ueda et al. | ................... 396/611 |
| 6,427,462 B1 | 8/2002 | Suenaga et al. | ................ 62/185 |
| 6,654,668 B1 | 11/2003 | Harada et al. | ................ 700/299 |
| 7,694,688 B2 * | 4/2010 | Lester | ............... H01L 21/67051 |
| | | | 134/140 |
| 7,699,021 B2 * | 4/2010 | Volfovski | ............... G03B 27/32 |
| | | | 118/50 |
| 10,170,349 B2 * | 1/2019 | Maeda | ................... B05D 1/005 |
| 2001/0013515 A1 | 8/2001 | Harada et al. | ................ 219/390 |
| 2003/0213431 A1 | 11/2003 | Fukutomi et al. | ............ 118/696 |
| 2008/0032426 A1 | 2/2008 | Michaelson et al. | ............. 438/7 |
| 2010/0032097 A1 | 2/2010 | Ohashi | ..................... 156/345.55 |
| 2013/0256267 A1 | 10/2013 | Ota et al. | ........................ 216/62 |

(Continued)

FOREIGN PATENT DOCUMENTS

| | | |
|---|---|---|
| JP | H04-137613 A | 5/1992 |
| JP | H09-219435 A | 8/1997 |

(Continued)

*Primary Examiner* — Sylvia MacArthur
(74) *Attorney, Agent, or Firm* — Ostrolenk Faber LLP

(57) ABSTRACT

A substrate processing apparatus including a plurality of baking chambers stacked in a prescribed direction, each baking chamber carrying out heat treatment of a substrate in its interior, a processing unit having a liquid processing chamber separate from the baking chambers and carrying out liquid processing of the substrate using the processing liquid, and an enclosing isolating space that encloses the sides of the plurality of baking chambers and isolates the baking chambers from the surrounding area.

8 Claims, 16 Drawing Sheets

(56) References Cited

U.S. PATENT DOCUMENTS

| | | | |
|---|---|---|---|
| 2015/0241787 A1 | 8/2015 | Yaegashi | |
| 2015/0287624 A1* | 10/2015 | Hatano | H01L 21/67178 414/222.13 |
| 2018/0090352 A1* | 3/2018 | Sotoku | H01L 21/67109 |

FOREIGN PATENT DOCUMENTS

| | | |
|---|---|---|
| JP | 2000-306825 A | 11/2000 |
| JP | 2001-110701 A | 4/2001 |
| JP | 3522469 B2 | 4/2004 |
| JP | 2008-060368 A | 3/2008 |
| JP | 2012-233240 A | 11/2012 |
| JP | 5270251 B2 | 8/2013 |
| KR | 10-2001-0062267 A | 7/2001 |
| KR | 10-2003-0086900 A | 11/2003 |
| TW | 200818259 | 4/2008 |
| TW | 201544895 A | 12/2015 |
| WO | WO 01/003169 A1 | 1/2001 |

\* cited by examiner

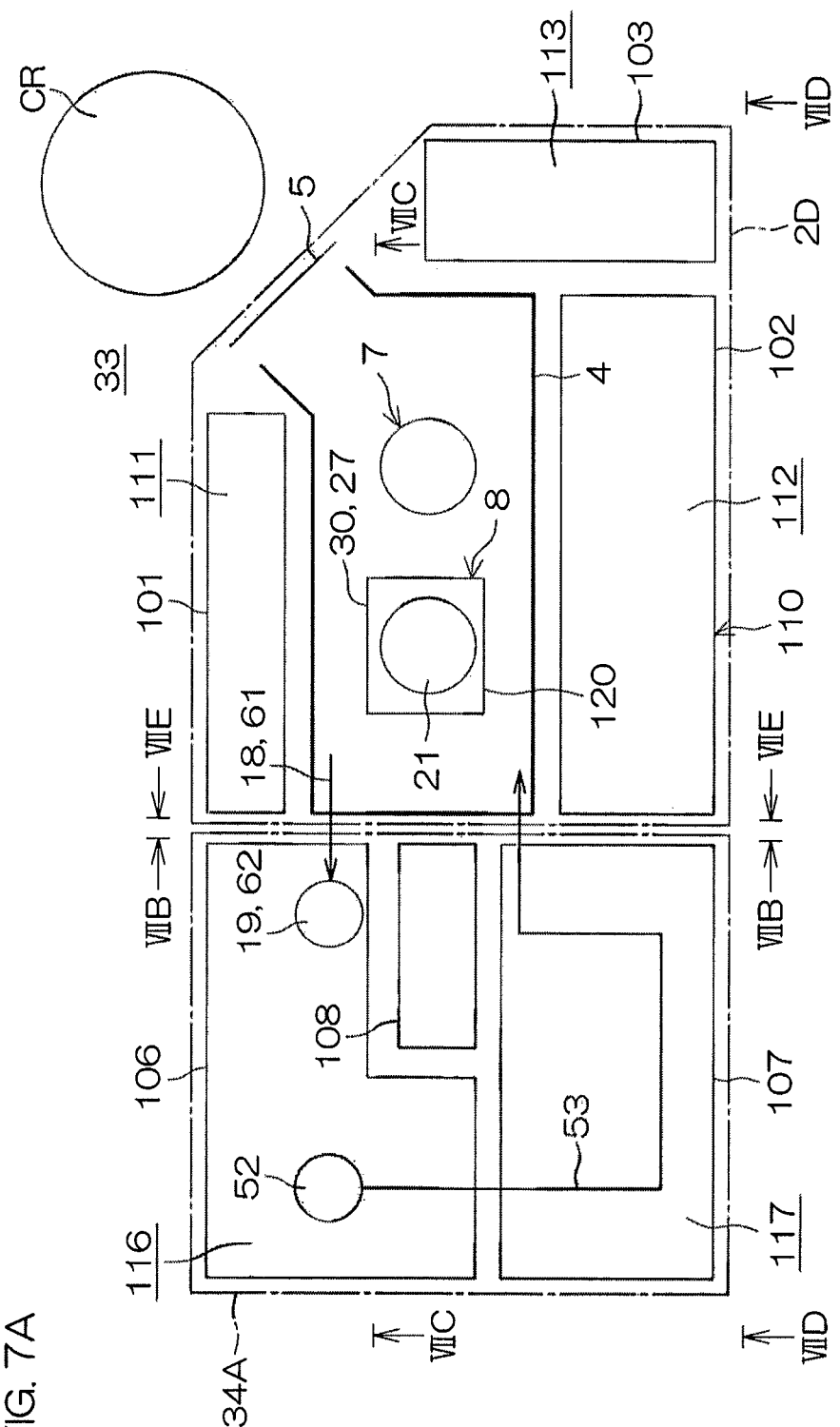

SUBSTRATE PROCESSING METHOD AND SUBSTRATE PROCESSING APPARATUS

BACKGROUND OF THE INVENTION

1. Field of the Invention

The present invention relates to a substrate processing apparatus that processes a substrate. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, substrates for solar cells, and the like.

2. Description of Related Art

In a manufacturing process for a semiconductor device or a liquid crystal display device, etc., a substrate processing apparatus is used that processes a substrate such as a semiconductor wafer or a glass substrate for liquid crystal display devices.

Such substrate processing apparatuses include ones that include, in the apparatus main body, a baking unit in which the substrate is heat treated, and a liquid processing unit in which a chemical liquid (etching solution or cleaning liquid) is supplied to the heat treated substrate for liquid processing (see US Unexamined Patent Application Publication No. 2013/256267 A1).

SUMMARY OF THE INVENTION

In this type of substrate processing apparatus, heat from the baking units may potentially be transmitted to the liquid processing unit or to the processing liquid supply device for supply of chemical liquid to the liquid processing unit, where the heat may affect liquid processing by altering the liquid temperature of the chemical liquid, for example. Alteration of the chemical liquid temperature results in changes in the processing rate of liquid processing and becomes one cause of processing irregularities during liquid processing. It is therefore preferred to carry out liquid processing in the liquid processing chamber in a state in which the thermal effects from the baking chambers (baking units) have been eliminated.

It is therefore one object of the present invention to provide a substrate processing apparatus that can carry out liquid processing in a state in which the thermal effects from the baking chambers are eliminated.

The present invention provides a substrate processing apparatus including a plurality of baking chambers stacked in a prescribed direction, each baking chamber carrying out heat treatment of a substrate in its interior, a processing unit having a liquid processing chamber separate from the baking chambers and carrying out liquid processing of the substrates using the processing liquid, and an enclosing isolating space that encloses the sides of the plurality of baking chambers and isolates the baking chambers from the surrounding area.

According to this configuration, the members in the area surrounding the baking chambers are thermally isolated from the baking chambers by the enclosing isolating space enclosing the sides of the stacked plurality of baking chambers. Consequently, it is possible to reduce or prevent heat from the baking chambers from affecting liquid processing in the liquid processing unit. Thus, liquid processing can be carried out in a state in which thermal effects from the baking chambers have been eliminated, and therefore generation of processing irregularities in liquid processing can be prevented.

According to a preferred embodiment of the present invention, the baking chambers each include a chamber that supplies processing gas to the substrate while heating the substrate.

According to this configuration, the members in the area surrounding the baking chambers are atmosphere-shielded from the atmosphere in the baking chambers, by the enclosing isolating space enclosing the sides of the stacked plurality of baking chambers. That is, even if processing gas has flowed out from the baking chambers, it is possible to block off, by the enclosing isolating space, the processing gas that has flowed out, it is thereby possible to reduce or prevent entry of the flowed processing gas into the members in the area surrounding the baking chambers.

The substrate processing apparatus may further include a container holding unit that holds a container for housing of the substrates. In this case, the liquid processing chamber may be disposed on the side opposite from the container holding unit with respect to the baking chambers.

According to this configuration, the liquid processing unit is disposed on the side opposite from the container holding unit with respect to the baking chambers. Consequently, the processing liquid supply device for supply of processing liquid to the liquid processing unit can be disposed at a distance away from the baking chambers. It is thereby possible to more effectively reduce heat transfer to the processing liquid supply device, and thus to carry out liquid processing in a state in which thermal effects from the baking chambers are more effectively eliminated.

The substrate processing apparatus may further include a transfer chamber for transfer of the substrates held by the container holding unit, to the baking chambers and the liquid processing chamber. In this case, the enclosing isolating space may include a first isolating space provided between the baking chambers and the transfer chamber.

The enclosing isolating space may include a second isolating space provided between the baking chambers and the outer wall of the substrate processing apparatus.

The enclosing isolating space may include a third isolating space provided between the baking chambers and the liquid processing chamber.

Each baking chamber may include in its interior a chamber that supplies processing gas to the substrate while heating the substrate. In this case, the enclosing isolating space may include a piping housing space that houses an exhaust piping through which exhaust from the baking chamber is circulated and/or a processing gas supply piping that supplies processing gas to the baking chamber, and an electrical device housing space that houses electrical devices associated with the baking chamber. In addition, the electrical device housing space may be disposed on the side opposite from the piping housing space with respect to the baking chamber.

According to this configuration, the piping housing space and the electrical device housing space are separated by the baking chamber. Therefore, even when processing gas has flowed out from the drain piping and/or processing gas supply piping, it is virtually impossible for the processing gas to enter the electrical device housing space. Although a maintenance operator may enter or leave the electrical device housing space, the processing gas does not enter the electrical device housing space, and this helps to prevent exposure of the operator to the processing gas.

Inside each baking chamber, there may be housed an inner chamber that supplies processing gas to the substrate while heating the substrate therein.

According to this configuration, a double chamber structure is employed having an inner chamber disposed in the interior of the baking chamber, and therefore it is possible to even more effectively reduce flow of processing gas out of the baking chamber.

According to this configuration, a shielded space shielded from the surrounding area can be easily formed together with the upper surface of the substrate.

The aforementioned as well as yet other objects, features, and effects of the present invention will be made clear by the following description of the preferred embodiments, with reference to the accompanying drawings.

BRIEF DESCRIPTION OF THE DRAWINGS

FIG. 7A is a schematic diagram for describing a layout of the dry processing unit and a gas box.

DETAILED DESCRIPTION OF PREFERRED EMBODIMENTS

Figure 1A:
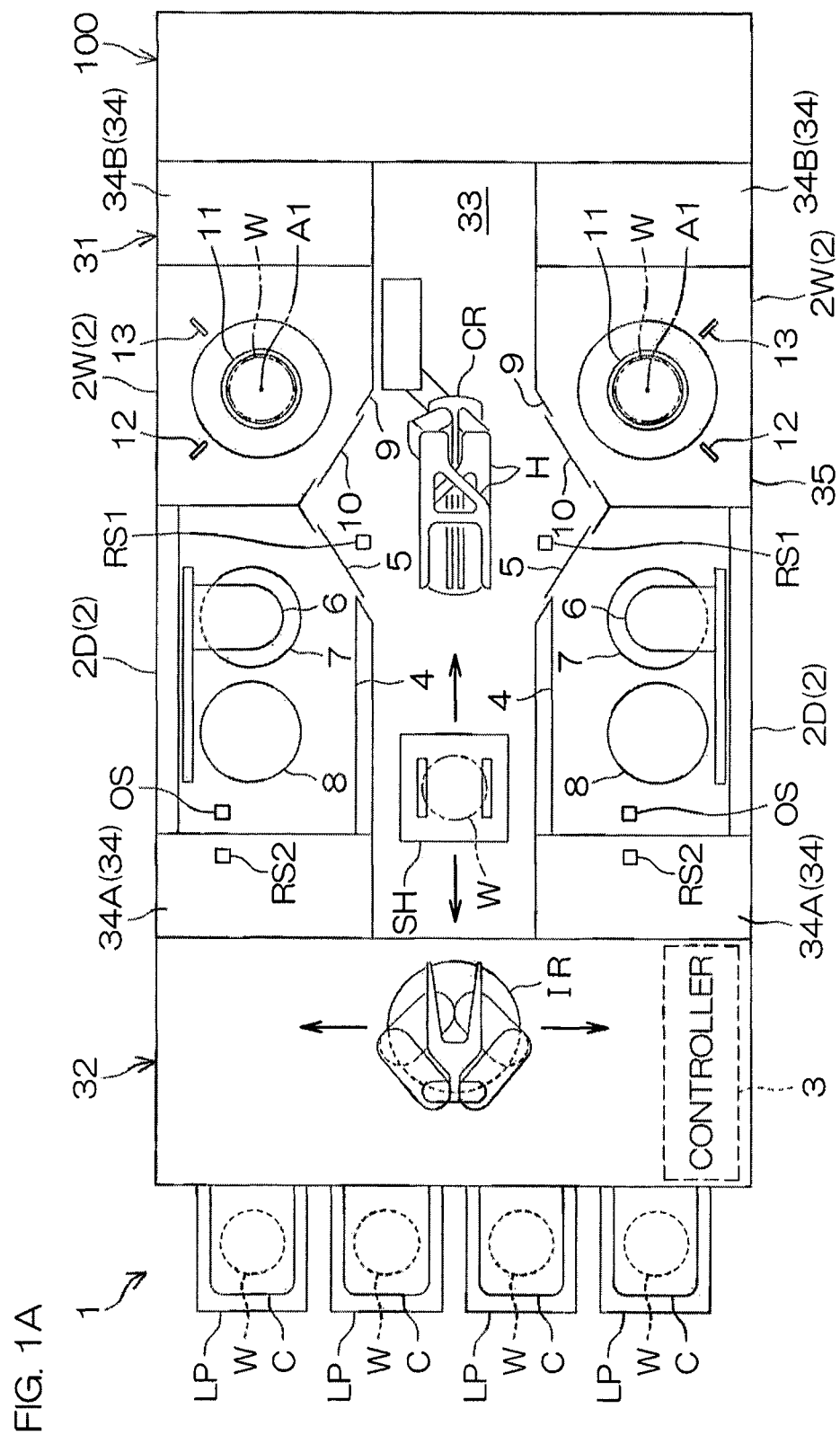
FIG. 1A is a schematic plan view showing the general configuration of a substrate processing apparatus according to a preferred embodiment of the present invention.
Figure 1B:
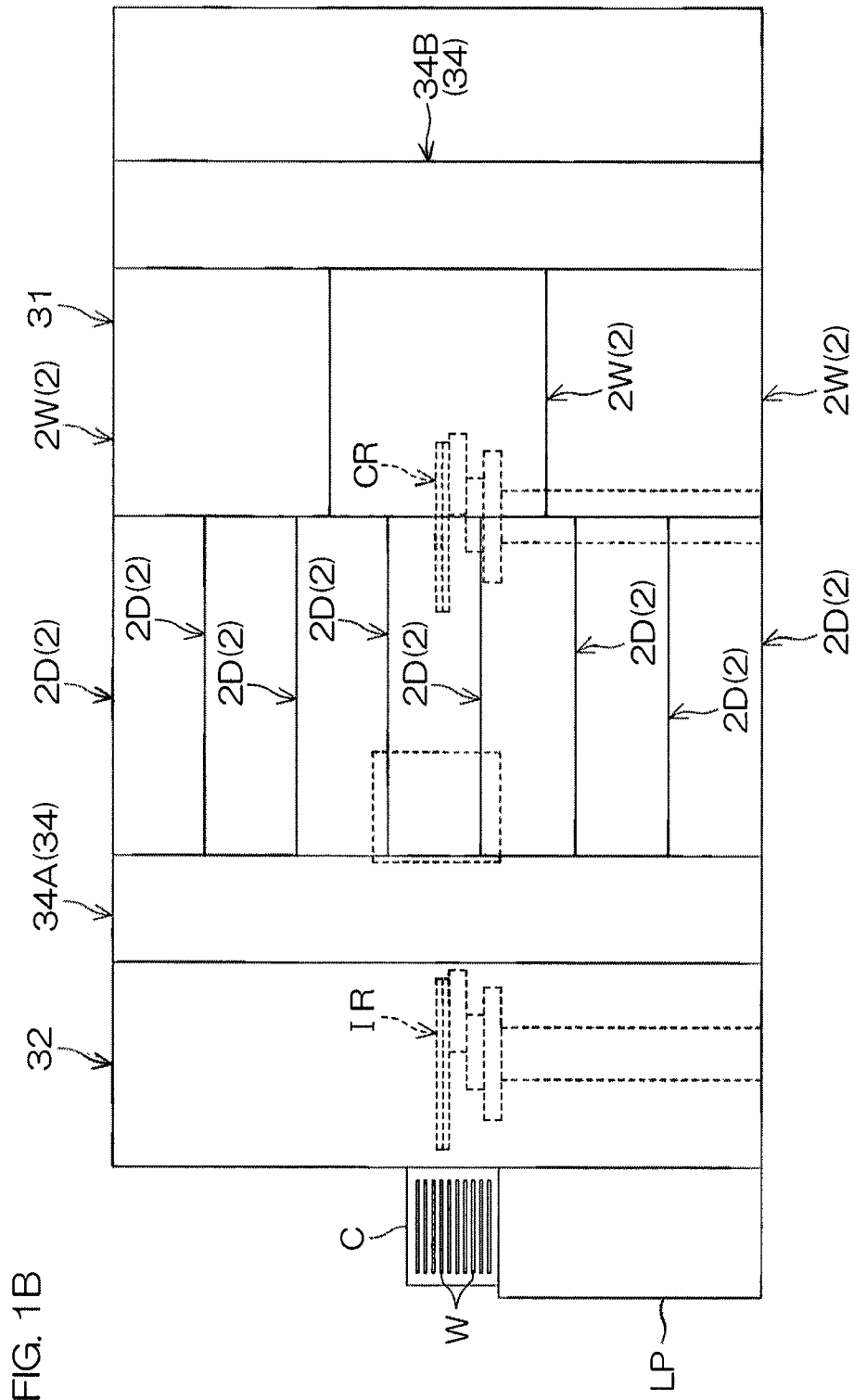
FIG. 1B is a schematic view of the interior of the substrate processing apparatus, as viewed from the horizontal direction.

FIG. 1A is a schematic plan view showing the general configuration of a substrate processing apparatus 1 according to a preferred embodiment of the present invention. FIG. 1B is a schematic view of the interior of the substrate processing apparatus 1, as viewed from the horizontal direction.

The substrate processing apparatus 1 is a single substrate processing type apparatus that conducts processing of disk-shaped substrates W such as semiconductor wafers, one at a time. The substrate processing apparatus 1 includes an apparatus main body 31, an indexer unit 32 coupled with the apparatus main body 31, and a controller 3 that controls the substrate processing apparatus 1.

The indexer unit 32 includes a plurality of load ports LP respectively holding a plurality of carriers each housing a substrate W, and an indexer robot IR for transfer of the substrate W to each carrier C.

The apparatus main body 31 includes a transfer chamber 33, and a plurality of processing units 2 that process the substrates W transferred from the plurality of load ports LP, using a processing fluid such as a processing liquid or processing gas. The plurality of processing units 2 form four towers disposed at four horizontally separated positions, respectively. Each tower includes a plurality of processing units 2 stacked in the vertical direction. The four towers are disposed with two at each of both sides of the transfer chamber 33. The plurality of processing units 2 each include a plurality of dry processing units 2D that each process a substrate W while the substrate W is dried, and a plurality of wet processing units (liquid processing units) 2W that each process the substrate W with the processing liquid. The two towers on the load port LP side are formed by a plurality of dry processing units 2D. In this preferred embodiment, each tower on the load port LP side includes a plurality of dry processing units 2D (for example, seven) stacked in the vertical direction, as shown in FIG. 1B. The remaining two towers are formed by a plurality of wet processing units 2W (for example, three). In this preferred embodiment, each tower on the load port LP side includes three wet processing units 2W, stacked in the vertical direction, as shown in FIG. 1B. As explained below, the period of time required for processing of a single substrate W in the dry processing unit 2D is longer than the period of time required for processing of a single substrate W in the wet processing unit 2W. Such being the case, the number of dry processing units 2D mounted in the substrate processing apparatus is greater than the number of wet processing units 2W, in order to prevent reduced throughput of the substrates W.

The substrate processing apparatus 1 includes a shuttle SH and a center robot CR, as transfer units in addition to the indexer robot IR. The shuttle SH and center robot CR are disposed inside the transfer chamber 33. The indexer robot IR transfers substrates W between the plurality of load ports LP and the shuttle SH. The shuttle SH transfers the substrates W between the indexer robot IR and the center robot CR. The center robot CR transfers the substrates W between the shuttle SH and the plurality of processing units 2. The center robot CR also transfers the substrates W between the plurality of processing units 2. The bold arrows in FIG. 1A indicate the movement direction of the indexer robot IR and the shuttle SH.

The substrate processing apparatus 1 includes fluid boxes 34 for housing of the pipings, valves, etc. The processing units 2 and fluid boxes 34 are disposed at outer walls 35 of the apparatus main body 31, or in other words they are surrounded by the outer walls 35. The fluid boxes 34 include gas boxes 34A corresponding to the dry processing units 2D, and liquid boxes 34B corresponding to the wet processing units 2W.

The gas boxes 34A are boxes for housing of the pipings, valves, etc. for supply and discharge of gas to and from the dry processing units 2D, and/or the electrical devices associated with the dry processing units 2D. The gas boxes 34A are disposed between the indexer unit 32 in which the indexer robot IR is disposed, and the dry processing units 2D.

The liquid boxes 34B are boxes for housing of the pipings, valves, etc. for supply and discharge of liquid to and from the wet processing units 2W, and/or the electrical devices associated with the wet processing units 2W. The liquid boxes 34B are disposed between the indexer unit 32 in which the indexer robot IR is disposed, and the wet processing units 2W.

The substrate processing apparatus 1 further includes a processing liquid supply device 100 that supplies processing liquid (chemical liquid (etching solution or cleaning liquid)) to the wet processing units 2W. The processing liquid supply device 100 is disposed on the outside of the outer wall 35. In this preferred embodiment, the processing liquid supply device 100 is disposed on the side opposite from the wet processing unit 2W with respect to the two liquid boxes 34B in plan view. The processing liquid supply device 100 supplies the processing liquid to each wet processing unit 2W through the corresponding liquid box 34B.

Each dry processing unit 2D includes a baking chamber 4 provided with a carry-in/carry-out port through which the substrate W passes, a shutter 5 that opens and closes the carry-in/carry-out port of the baking chamber 4, a heating unit 8 that supplies processing gas to the substrate W while heating the substrate W in the baking chamber 4, a cooling unit 7 that cools, in the baking chamber 4, the substrate W that has been heated by the heating unit 8, and an interior transfer unit 6 that transfers the substrate W in the baking chamber 4. The heating unit 8, cooling unit 7 and interior transfer unit 6 may be provided in a movable manner along the horizontal direction that is perpendicular to the direction in which the transfer chamber 33 extends.

Each wet processing unit 2W includes a wet chamber 9 provided with a carry-in/carry-out port through which the substrate W passes, a shutter 10 that opens and closes the carry-in/carry-out port of the wet chamber 9, a spin chuck 11 that holds the substrate W horizontally in the wet chamber 9 while rotating the substrate W around a vertical rotational axis Al running through the center portion of the substrate W, and a plurality of nozzles that discharge processing liquid toward the substrate W that is held by the spin chuck 11.

The plurality of nozzles include a chemical liquid nozzle 12 that discharges chemical liquid and a rinse liquid nozzle 13 that discharges rinse liquid. The controller 3 holds the substrate W on a plurality of chuck pins of the spin chuck 11, while rotating the substrate W on the spin motor of the spin chuck 11. In this state, the controller 3 causes liquid to be discharged through the chemical liquid nozzle 12 or rinse liquid nozzle 13, toward the upper surface of the substrate W. This causes the entire region of the upper surface of the substrate W to be covered by a liquid film. Next, the controller 3 causes the spin chuck 11 to rotate the substrate W at a high speed to dry the substrate W.

Figure 2:
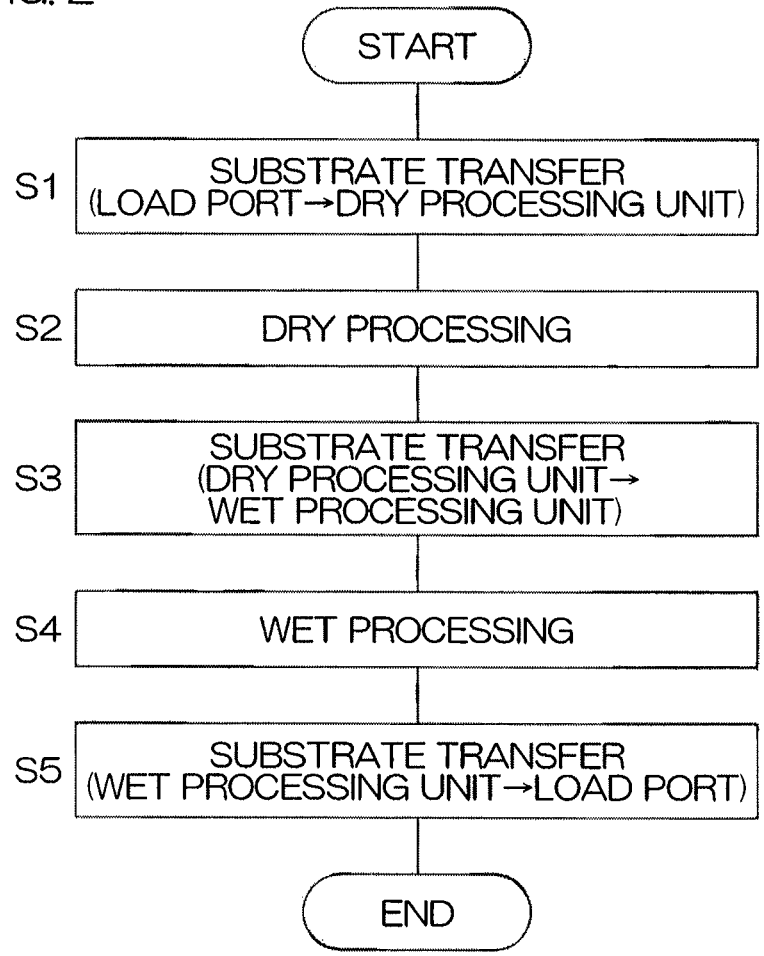
FIG. 2 is a flow chart showing an example of processing of a substrate carried out by the substrate processing apparatus.
Figure 3:
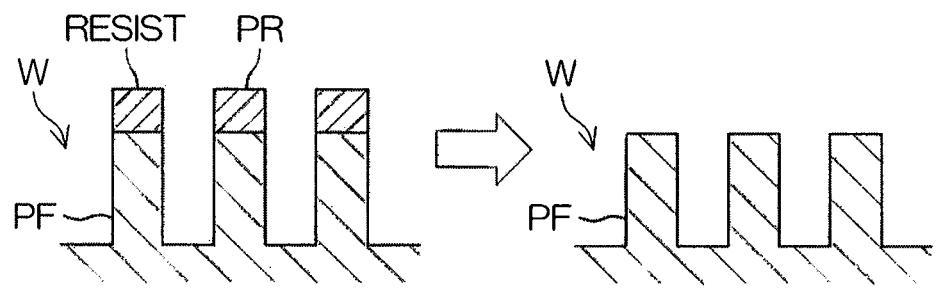
FIG. 3 is a schematic view showing a cross-section of a substrate before and after carrying out the example of substrate processing shown in FIG. 2.

FIG. 2 is a flow chart showing an example of processing of a substrate W carried out by the substrate processing apparatus 1. FIG. 3 is a schematic view showing a cross-section of a substrate W before and after carrying out the example of substrate W processing shown in FIG. 2. The controller 3 is programmed so as to cause the following steps to be carried out by the substrate processing apparatus 1.

As shown at left in FIG. 3, the substrate W to be processed by the substrate processing apparatus 1 is a substrate that has been subjected to an etching treatment step, in which a thin-film covered by a resist pattern PR is etched, forming a thin-film pattern PF. That is, the carrier C in which the substrate W is housed is set on the load port LP. As explained below, in the substrate processing apparatus 1, a resist removal step is carried out in which the resist pattern PR positioned on the thin-film pattern PF is removed. The right in FIG. 3 shows a cross-section of a substrate W that has been subjected to a resist removal step.

When a substrate W is processed in the substrate processing apparatus 1, the indexer robot IR, shuttle SH and the center robot CR transfer the substrate W in the carrier C placed in the load port LP, to the dry processing unit 2D (step 51 of FIG. 2). At the dry processing unit 2D, a dry processing step is carried out in which ozone gas, as an example of processing gas, is supplied to the substrate W while heating the substrate W (step S2 of FIG. 2). Next, the center robot CR carries the substrate W in the dry processing unit 2D into the wet processing unit 2W (step S3 of FIG. 2).

At the wet processing unit 2W, the substrate W is rotated while wet processing (liquid processing) is carried out in which processing liquid is supplied to the upper surface of the substrate W (step S4 of FIG. 2). Specifically, the substrate W is rotated while a first chemical liquid supply step is carried out in which a first chemical liquid (for example, hydrofluoric acid (HF)) is discharged toward the upper surface of the substrate W through the chemical liquid nozzle 12. Next, the substrate W is rotated while a rinse liquid supply step is carried out in which rinse liquid is discharged toward the upper surface of the substrate W through the rinse liquid nozzle 13. Next, the substrate W is rotated while a first chemical liquid supply step is carried out in which a second chemical liquid (for example, SC1 (ammonia/hydrogen peroxide water mixture) is discharged toward the upper surface of the substrate W through the chemical liquid nozzle 12. Next, the substrate W is rotated while a rinse liquid supply step is carried out in which rinse liquid is discharged toward the upper surface of the substrate W through the rinse liquid nozzle 13. Next, a drying step is carried out in which the substrate W is dried by high-speed rotation of the substrate W. The wet processing may be, instead of two chemical liquid supply steps, processing consisting of only a single chemical liquid supply step. In this case, the chemical liquid used may be SC1, for example. Also, prior to the drying step, a surface modifier (silylating agent) and/or a low surface tension liquid (an organic solvent such as isopropyl alcohol (IPA)) may be supplied to the upper surface of the substrate W. Next, the indexer robot IR, shuttle SH and the center robot CR transfer the substrate W in the wet processing unit 2W to the carrier C placed in the load port LP (step S5 of FIG. 2).

The dry processing unit 2D will now be explained in detail.

Figure 4:
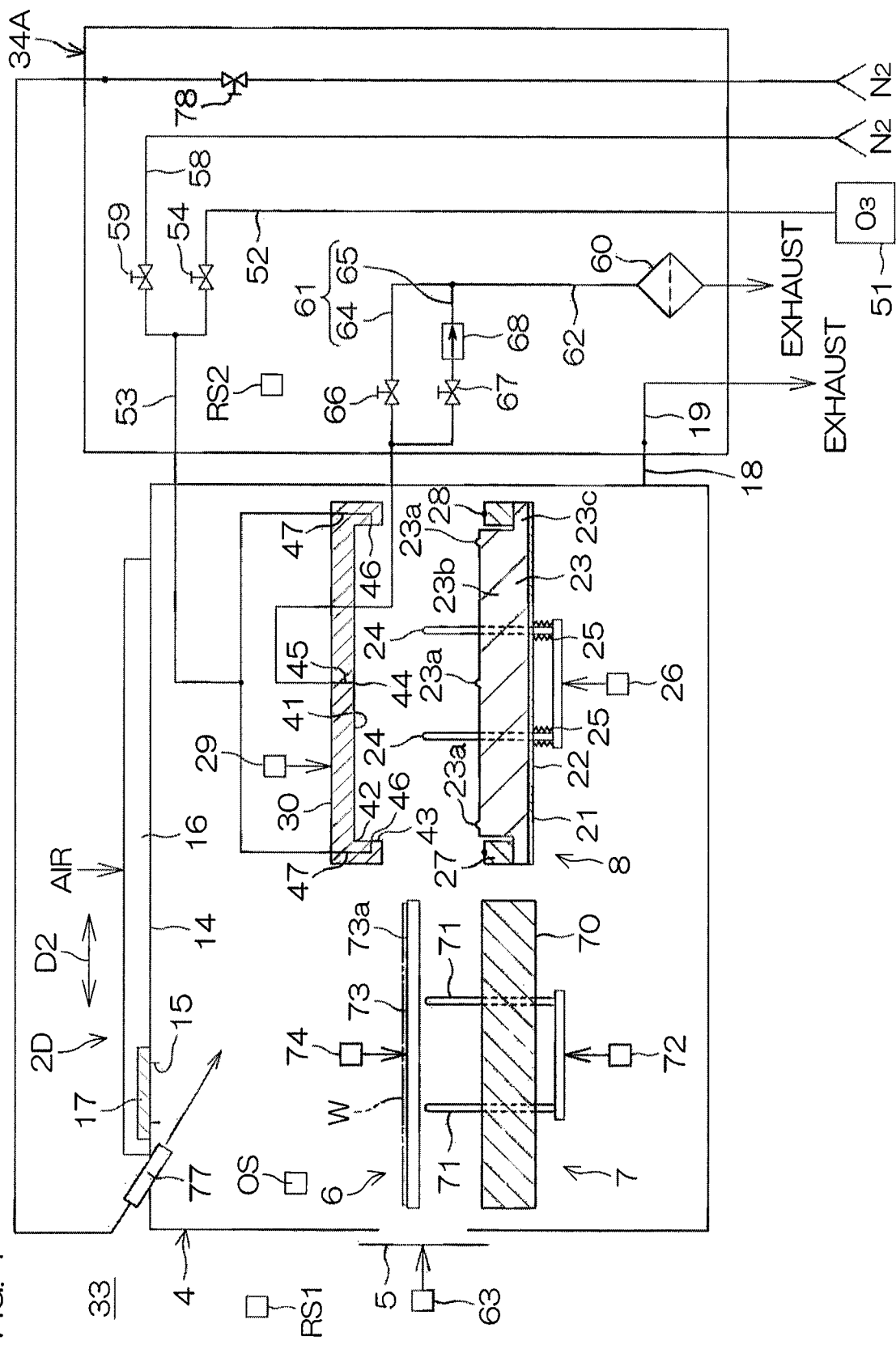
FIG. 4 is a schematic horizontal view of the interior of a dry processing unit shown in FIG. 1A.
Figure 5:
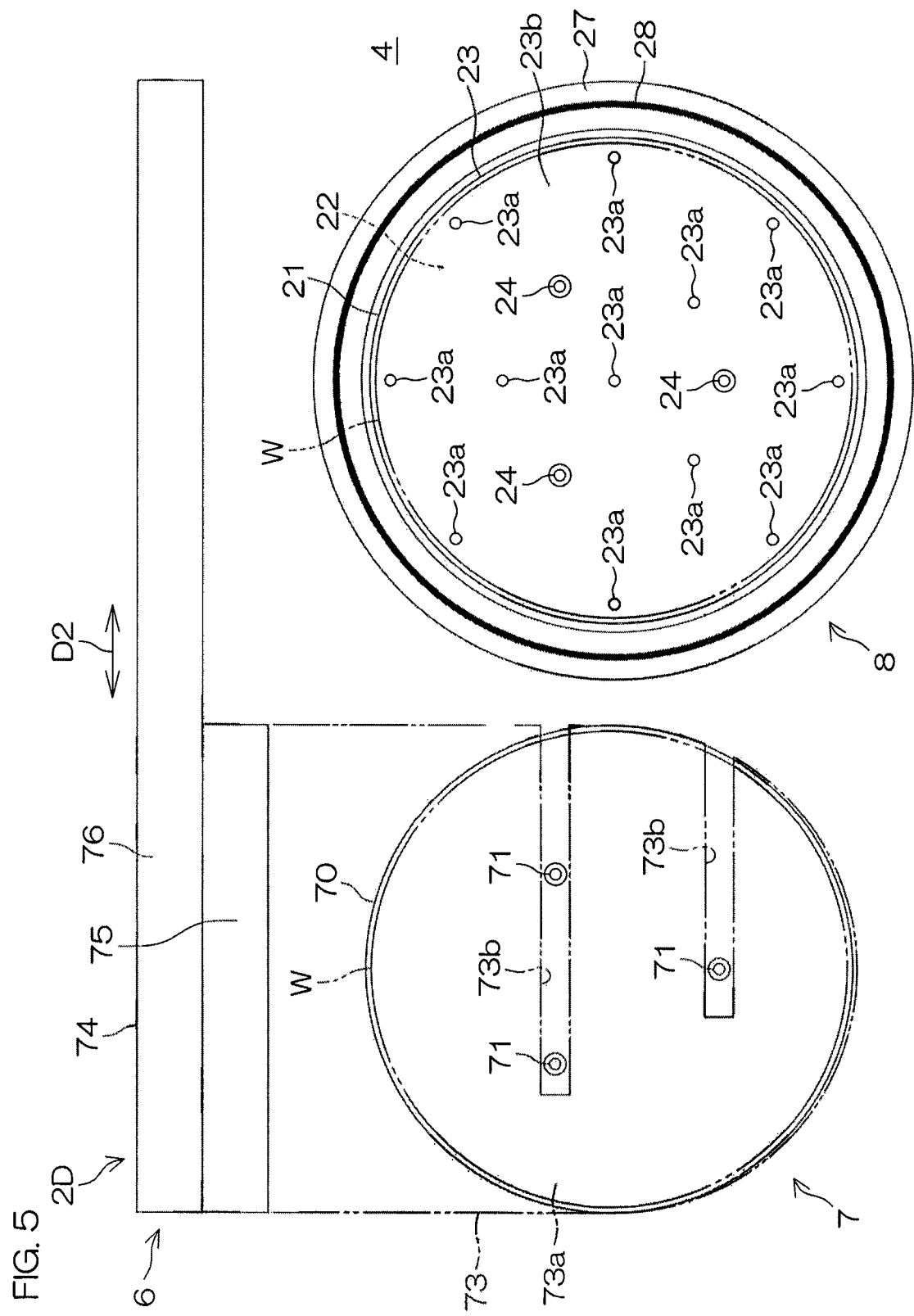
FIG. 5 is a schematic view of the cooling plate and hot plate in the dry processing unit, as viewed from above.

FIG. 4 is a schematic horizontal view of the interior of the dry processing unit 2D. FIG. 5 is a schematic view of a cooling plate 70 and hot plate 21 in the dry processing unit 2D, as viewed from above.

The dry processing unit 2D includes a baking chamber 4, and a first gas supply unit and a first exhaust unit for formation of a downflow inside the baking chamber 4. The baking chamber 4 has a box-shaped partition wall 14.

The first gas supply unit includes a gas supply port 15 formed at a top portion of the partition wall 14 (for example, the ceiling face), and a gas supply channel 16 provided above the baking chamber 4, through which external air that has been taken into the apparatus main body 31 circulates. The gas supply port 15 communicates with the gas supply channel 16 via a filter 17. The gas supply port 15 is disposed, specifically, near an area above the shutter 5 at the ceiling face of the partition wall 14, for example.

The first exhaust unit includes an individual exhaust piping (exhaust piping) 18 that discharges gas in each baking chamber 4 from the lower portion of the partition wall 14 of the baking chamber 4, and a converged exhaust piping (exhaust piping) 19 that guides the exhaust from the plurality of individual exhaust pipings 18. The converged exhaust piping 19 guides gas in the baking chamber 4 toward exhaust processing equipment provided in the factory in which the substrate processing apparatus 1 is installed. During operation of the substrate processing apparatus 1, discharge is constantly carried out through the converged exhaust piping 19, and therefore discharge is also constantly carried out through the exhaust pipings 18, 19. Thus, a downflow (downward flow) flowing downward is formed in the baking chamber 4. The processing of the substrate W is carried out with a downflow formed in the baking chamber 4. Since the specific gravity of ozone gas is heavier than air, formation of the downflow is even further accelerated.

As shown in FIG. 4, the cooling unit 7 includes a cooling plate 70 kept at a lower temperature than the hot plate 21 described below, a plurality of first lift pins 71 that support the substrate W horizontally above the cooling plate 70, and a first lift raising/lowering actuator 72 that raises and lowers the plurality of first lift pins 71.

The cooling plate 70 is disposed on the side of the carry-in/carry-out port side of the baking chamber 4 with respect to the hot plate 21. The hot plate 21 and cooling plate 70 are arranged in a horizontal arrangement direction D2. The cooling plate 70 includes a circular horizontal upper surface having a larger outer diameter than the outer diameter of the substrate W. The plurality of first lift pins 71 are inserted respectively into a plurality of through-holes running through the cooling plate 70.

The upper end portions of the plurality of first lift pins 71 are disposed at the same height. Each first lift pin 71 includes a hemispherical upper end portion that contacts the lower surface of the substrate W. The first lift raising/lowering actuator 72 moves the plurality of first lift pins 71 vertically, between an upper position where the upper end portions of the plurality of first lift pins 71 are positioned higher than the cooling plate 70 (the position shown in FIG. 4), and a lower position where the upper end portions of the plurality of first lift pins 71 are retreated into the cooling plate 70 (the position shown in FIG. 9B). The first lift raising/lowering actuator 72 may be an electric motor or an air cylinder. It may also be an actuator other than one of these. The same description applies for other actuators as well.

The heating unit 8 includes a hot plate 21 that heats the substrate W while supporting the substrate W horizontally, a hood 30 disposed above the substrate W being supported by the hot plate 21, and a base ring 27 capable of supporting the hood 30. The heating unit 8 also includes a hood raising/lowering actuator 29 that raises and lowers the hood 30 with respect to the hot plate 21 and base ring 27, a plurality of second lift pins 24 that support the substrate W horizontally between the hot plate 21 and the hood 30, and a second lift raising/lowering actuator 26 that raises and lowers the plurality of second lift pins 24.

The hot plate 21 includes a heater 22 that generates Joule heat, and a support member 23 that supports the substrate W horizontally while transmitting heat from the heater 22 to the substrate W. The heater 22 and support member 23 are disposed below the substrate W. The heater 22 is connected to wiring (not shown) that supplies electric power to the heater 22. The heater 22 may be disposed below the support member 23, or it may be disposed inside the support member 23.

The support member 23 of the hot plate 21 includes a disk-shaped base portion 23b disposed below the substrate W, a plurality of hemispherical protrusions 23a protruding upward from the upper surface of the base portion 23b, and an annular flange portion 23c protruding outward from the outer peripheral surface of the base portion 23b. The upper surface of the base portion 23b is parallel with the lower surface of the substrate W and has an outer diameter that is equal to or greater than the outer diameter of the substrate W. The plurality of protrusions 23a contact the lower surface of the substrate W at a position that is a distance above the upper surface of the base portion 23b. The plurality of protrusions 23a are disposed at a plurality of positions within the upper surface of the base portion 23b, so that the substrate W is supported horizontally. The substrate W is supported horizontally in a state such that the lower surface of the substrate W is at a distance above the upper surface of the base portion 23b.

The plurality of second lift pins 24 are inserted respectively into a plurality of through-holes running through the hotplate 21. Entry of fluid from outside the heating unit 8 into the through-holes is prevented by bellows 25 surrounding the second lift pin 24. The heating unit 8 may include, either instead of the bellows 25 or in addition to the bellows 25, an O-ring that seals the gap between the outer peripheral surfaces of the second lift pins 24 and the inner peripheral surfaces of the through-holes. Each second lift pin 24 includes a hemispherical upper end portion that contacts the lower surface of the substrate W. The upper end portions of the plurality of second lift pins 24 are disposed at the same height. The second lift raising/lowering actuator 26 moves the plurality of second lift pins 24 in the vertical direction, between an upper position where the upper end portions of the plurality of second lift pins 24 are positioned higher than the hot plate 21 (the position shown in FIG. 4), and a lower position where the upper end portions of the plurality of second lift pins 24 are retreated into the hot plate 21 (the position shown in FIG. 9A).

The base ring 27 is disposed on the upper surface of the flange portion 23c of the hot plate 21. The base ring 27 surrounds the base portion 23b leaving an interval in the radial direction of the hot plate 21. The upper surface of the base ring 27 is disposed lower than the upper surface of the base portion 23b. An O-ring 28 is fitted into an annular groove that is depressed downward from the upper surface of the base ring 27. When the hood 30 is placed on the base ring 27, a closed space SP housing the substrate W being supported by the hot plate 21 (see FIG. 9A) is formed by the hot plate 21, the hood 30 and the base ring 27.

Figure 9A:
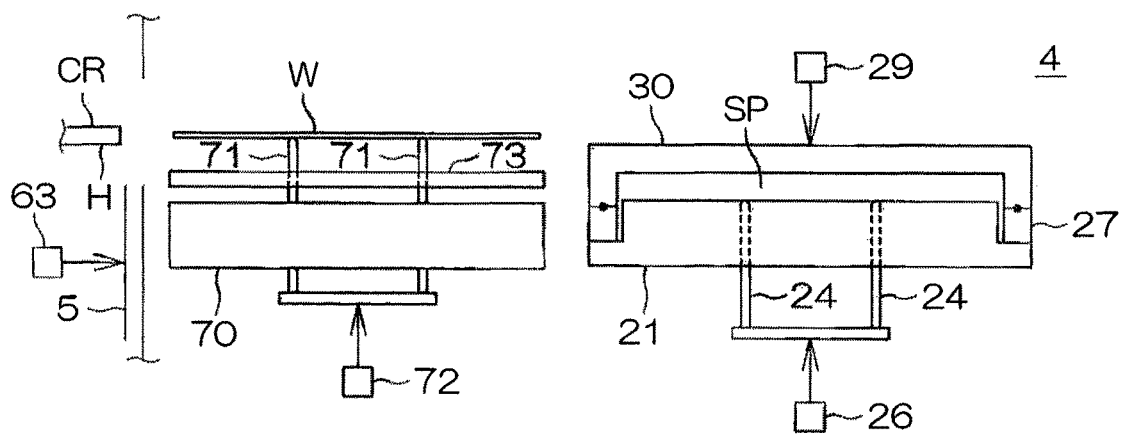
FIGS. 9A to 9O are schematic views showing the state inside a baking chamber when dry processing is being carried out.

The hood raising/lowering actuator 29 moves the hood 30 vertically between the upper position (the position shown in FIG. 4) and the lower position (the position shown in FIG. 9A). The upper position is a position where the hood 30 is at a distance above the base ring 27 to allow the substrate W to pass between the hood 30 and the base ring 27. The lower position is a position where the gap between the hood 30 and the base ring 27 is sealed, and the closed space SP is formed housing the substrate W that is being supported by the hot plate 21.

The substrate processing apparatus 1 includes a second gas supply unit that supplies gas into the heating unit 8, and a second exhaust unit that discharges gas in the heating unit 8. The second gas supply unit includes a plurality of gas supply ports 46 that discharge gas, and a supply channel 47 that guides the gas to each gas supply port 46. The exhaust unit includes an exhaust port 44 through which gas that has been discharged from the plurality of gas supply ports 46 flows in, and an exhaust channel 45 that guides the gas that has flowed into the exhaust port 44, out of the heating unit 8.

The inner side of the hood 30 includes a ceiling face 41 that is circular in plan view, disposed above the substrate W, a cylinder surface 43 having a larger diameter than the outer diameter of the substrate W, and an annular corner portion 42 extending from the outer edge of the ceiling face 41 to the upper edge of the cylinder surface 43. The ceiling face 41 has a larger outer diameter than the outer diameter of the substrate W. The ceiling face 41 has a horizontal surface that is parallel with the upper surface of the substrate W that is being supported by the hot plate 21. The exhaust port 44 opens at the ceiling face 41. The plurality of gas supply ports 46 open at the cylinder surface 43. The plurality of gas supply ports 46 are disposed at the same height, for example. The plurality of gas supply ports 46 are arranged at equal intervals in the circumferential direction of the hot plate 21. The gas supply port 46 may instead open at a surface other than the cylinder surface 43 of the hood 30, as long as it is a surface forming the closed space SP. The same applies for the exhaust port 44 as well.

The first gas supply unit further includes an individual gas supply piping (ozone gas supply piping) 53 connected to the supply channel 47 of each individual baking chamber 4, a converged ozone gas piping (ozone gas supply piping) 52 that guides ozone gas generated by an ozone gas generating unit 51 to the individual gas supply piping 53, and an ozone gas supply valve 54 interposed in the converged ozone gas piping 52. The ozone gas generating unit 51 is disposed at a position distant from the apparatus main body 31 (for example, downstairs). The first gas supply unit also includes a nitrogen gas piping 58 that guides nitrogen gas, supplied from a nitrogen gas supply source, to the individual gas supply piping 53, and a nitrogen gas supply valve 59 interposed in the nitrogen gas piping 58.

While not shown, the ozone gas supply valve 54 includes a valve body forming a flow channel, a valve element disposed in the flow channel, and an actuator that moves the valve element. The same applies for the other valves as well. The actuator may be a pneumatic actuator or an electric actuator, or a different type of actuator. The controller 3 opens and closes the ozone gas supply valve 54 by controlling the actuator.

The first exhaust unit further includes an individual exhaust piping (exhaust piping) 61 connected to the exhaust channel 45 of each baking chamber 4, a converged exhaust piping (exhaust piping) 62 that guides exhaust from a plurality of individual exhaust pipings 61, and an ozone filter 60 that removes ozone in gas flowing through the converged exhaust piping 62. One converged exhaust piping 62 is provided for each tower. The individual exhaust piping 61 includes a first individual exhaust piping 64 that connects the exhaust channel 45 and the converged exhaust piping 62, and a second individual exhaust piping 65 that connects the exhaust channel 45 and the converged exhaust piping 62, in parallel with the first individual exhaust piping 64. A first exhaust valve 66 is interposed in the first individual exhaust piping 64. In the second individual exhaust piping 65, there are interposed a second exhaust valve 67, and an ejector-type suction unit 68 such as a Convum™ or aspirator. The first exhaust valve 66 is kept in a constantly open state, and when the atmosphere in the heating unit 8 is to be replaced from ozone gas to nitrogen gas, etc., the first exhaust valve 66 is closed and the second exhaust valve 67 is opened.

The ozone gas in the heating unit 8 is discharged from the plurality of gas supply ports 46 with the heating unit 8 in the closed state, i.e. a state with the hood 30 positioned at the lower position. The ozone gas that has been discharged from the plurality of gas supply ports 46 is discharged to the converged exhaust piping 62 through the exhaust port 44, the exhaust channel 45 and the individual exhaust piping 61. The ozone gas in the exhaust pipings 61, 62 passes through the ozone filter 60. This lowers the concentration of ozone in the gas flowing through the exhaust pipings 61, 62. The gas that has passed through the ozone filter 60 is guided toward exhaust equipment provided in the factory in which the substrate processing apparatus 1 is installed.

The interior transfer unit 6 includes an interior hand 73 that supports the substrate W horizontally in the baking chamber 4, and a hand moving mechanism 74 that moves the interior hand 73. As shown in FIG. 5, the hand moving mechanism 74 includes a vertical driving mechanism 75 that moves the interior hand 73 vertically, and a horizontal driving mechanism 76 that moves the interior hand 73 in the arrangement direction D2 together with the vertical driving mechanism 75. The vertical driving mechanism 75 and horizontal driving mechanism 76 both include an actuator such as an electric motor.

The upper surface and lower surface of the interior hand 73 are both horizontal surfaces. The upper surface of the interior hand 73 includes a circular horizontal supporting member 73a having a larger outer diameter than the outer diameter of the substrate W. The plurality of first lift pins 71 of the cooling unit 7 are inserted in a plurality of notches 73b running through the interior hand 73 in the vertical direction. The plurality of second lift pins 24 of the heating unit 8 are similarly inserted in a plurality of notches 73b. The notches 73b extend horizontally in the arrangement direction D2, and open at the edge of the interior hand 73. The interior hand 73 is horizontally movable in the arrangement direction D2 even when the first lift pin 71 or second lift pin 24 is inserted in the notch 73b.

The horizontal driving mechanism 76 moves the interior hand 73 horizontally, thereby causing the interior hand 73 to be inserted between the hot plate 21 and the hood 30. The horizontal driving mechanism 76 positions the interior hand 73 above the hot plate 21 in such a manner that the entire substrate W supported on the interior hand 73 overlaps with the hot plate 21 in plan view. Likewise, by moving the interior hand 73 horizontally, the horizontal driving mechanism 76 positions the interior hand 73 above the cooling plate 70 in such a manner that the entire substrate W supported on the interior hand 73 overlaps with the cooling plate 70 in plan view.

The vertical driving mechanism 75 moves the interior hand 73 vertically between the hot plate 21 and the hood 30. During this time, the vertical driving mechanism 75 moves the interior hand 73 vertically between an upper non-contact position (the position shown in FIG. 9C), where the upper surface of the interior hand 73 is positioned higher than the upper end portion of the second lift pin 24 that is positioned at the upper position, and a lower non-contact position (the position shown in FIG. 9D), where the upper surface of the interior hand 73 is positioned lower than the upper end portion of the second lift pin 24 that is positioned at the upper position, and where the lower surface of the interior hand 73 is at a distance above the upper surface of the hot plate 21.

The vertical driving mechanism 75 moves the interior hand 73 vertically between an upper non-contact position (the position shown in FIG. 9B), where the upper surface of the interior hand 73 is positioned higher than the upper end portion of the first lift pin 71 that is positioned at the upper position, with the interior hand 73 in a state positioned above the cooling plate 70, and a lower non-contact position (the position shown in FIG. 9A), where the upper surface of the interior hand 73 is positioned lower than the upper end portion of the first lift pin 71 that is positioned at the upper position, and where the lower surface of the interior hand 73 is at a distance above the upper surface of the hot plate 21. The vertical driving mechanism 75 also moves the interior hand 73 to a contact position (the position shown in FIG. 9F) where the lower surface of the interior hand 73 contacts the upper surface of the cooling plate 70.

At the ceiling face of the partition wall 14 of the baking chamber 4, there is disposed a gas nozzle 77 that blows inert gas toward in a direction directly below the gas supply port 15. The design is such that inert gas is supplied to the gas nozzle 77 through an inert gas valve 78. Discharge of inert gas from the discharge port of the gas nozzle 77 not only results in supply of the inert gas to the baking chamber 4, but also prevents entry of the atmosphere of the baking chamber 4 (for example, the atmosphere including the ozone gas nozzle) into the gas supply channel 16 through the gas supply port 15. The inert gas supplied to the gas nozzle 77 may be nitrogen gas for the example of FIG. 4, but air (clean dry air) may instead be used as the inert gas.

In the region in the baking chamber 4 on the outside of the heating unit 8, there is disposed an ozone gas concentration sensor OS for detection of the ozone gas concentration in the baking chamber 4.

Also, in the transfer chamber 33, there is disposed a first leak sensor RS1 for detection of leakage of ozone gas from the baking chamber 4 to the transfer chamber 33.

In the gas box 34A, there is disposed a second leak sensor RS2 for detection of leakage of ozone gas from the baking chamber 4 to the fluid box.

In the dry processing illustrated in FIG. 2, the controller 3 checks the ozone gas concentration in the transfer chamber 33 and the ozone gas concentration in the gas box 34A, referring to the detected output from the first leak sensor RS1 and the second leak sensor RS2, and monitors whether or not ozone gas is flowing out in the transfer chamber 33 and gas box 34A.

Also, in the dry processing illustrated in FIG. 2, the controller 3 checks the ozone gas concentration in the baking chamber 4, referring to the detected output from the ozone gas concentration sensor OS. When the ozone gas concentration in the baking chamber 4 exceeds a prescribed concentration, inert gas is discharged from the discharge port of the gas nozzle 77. This makes it possible to prevent entry of atmosphere in the baking chamber 4 into the gas supply channel 16 through the gas supply port 15, while reducing the ozone gas concentration in the baking chamber 4.

Figure 6:
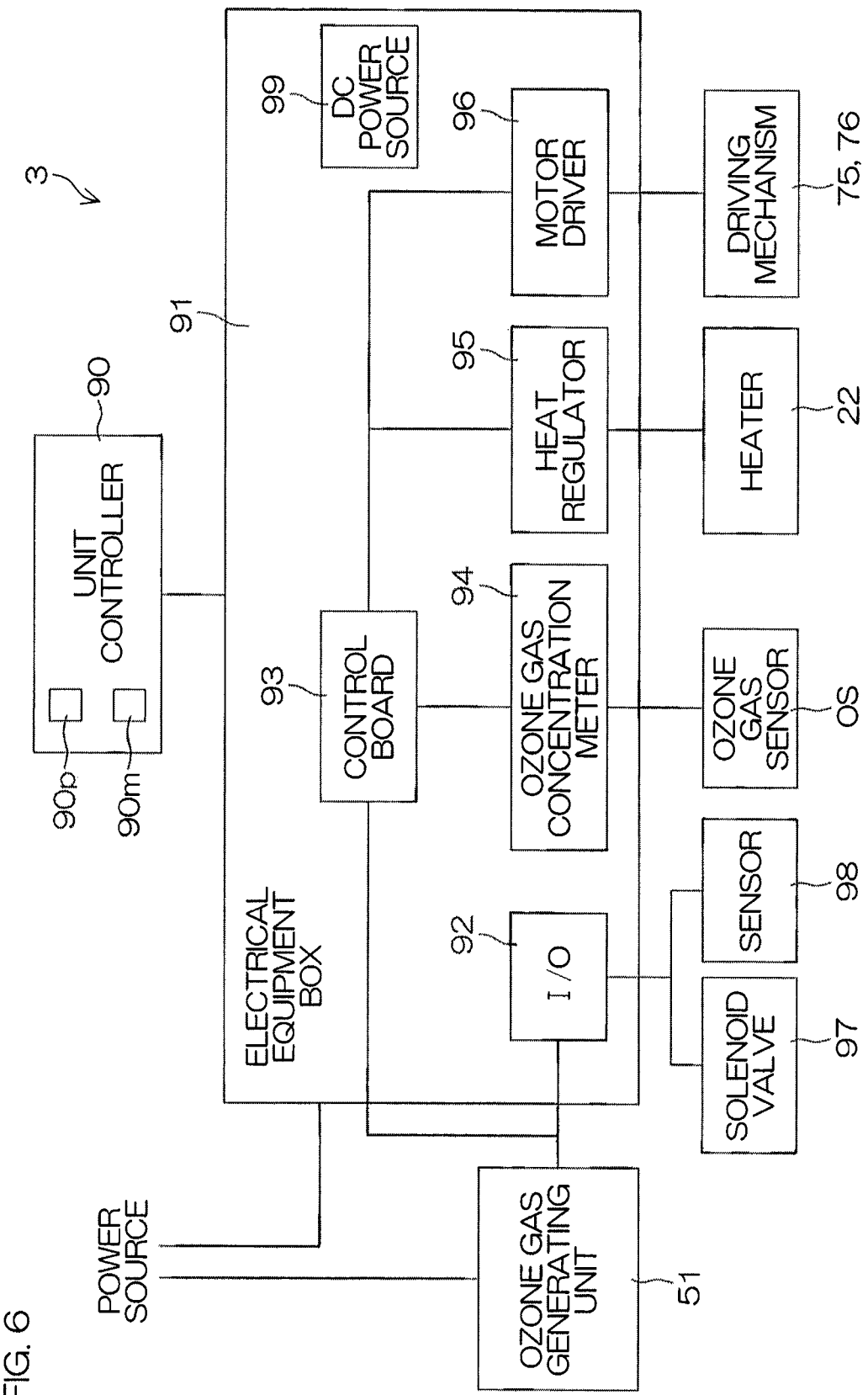
FIG. 6 is a block diagram for describing an electrical configuration of the substrate processing apparatus.

FIG. 6 is a block diagram for describing the electrical configuration of the substrate processing apparatus 1.

The controller 3 is a computer including a memory that stores data such as a program, and a processor that controls the substrate processing apparatus 1 according to the data stored in the memory.

The controller 3 includes a unit controller 90 that controls the dry processing unit 2D. The unit controller 90 is composed of a control VME (VERSAmodule Eurocard) board, for example, and includes a processor portion 90p that carries out computational processing, and a memory 90m that contains a storage device such as a solid memory device or hard disk drive. The memory stores data and the like relating to processing by the substrate processing apparatus 1.

Electrical equipment in an electrical equipment box 91 is connected to the unit controller 90. Specifically, the electrical equipment box 91 includes an I/O 92, a control board 93, an ozone gas concentration meter 94, a heat regulator 95, a motor driver 96, and the like. The ozone gas concentration meter 94, heat regulator 95 and the motor driver 96 are connected to the control board 93. The ozone gas generating unit 51 is connected to the I/O 92 and control board 93.

A voltage for driving of the dry processing unit 2D and ozone gas generating unit 51 is supplied from an external power source to the unit controller 90. Also, a DC power source 99 is built into the electrical equipment box 91 for driving of the electrical equipment box 91.

In addition, driving parts, sensors and the like for the dry processing unit 2D are connected to the unit controller 90, through the electrical equipment in the electrical equipment box 91. Specifically, there are connected to the unit controller 90, a solenoid valve 97 for driving of the second lift raising/lowering actuator 26 and/or hood raising/lowering actuator 29, and sensors (a sensor that detects the height positions of the second lift pins 24 and/or a sensor that detects the height position of the hood 30) 98 for driving of the second lift raising/lowering actuator 26 and/or hood raising/lowering actuator 29. Also, the ozone gas concentration sensor OS is connected to the ozone gas concentration meter 94. The heater 22 is connected to the heat regulator 95 to be driven by the heat regulator 95. The vertical driving mechanism 75 and horizontal driving mechanism 76 are connected to the motor driver 96.

Figure 7B:
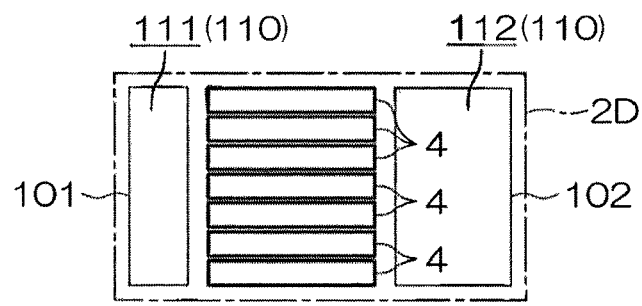
FIG. 7B is a view of FIG. 7A along cross-sectional line VIIB-VIIB.
Figure 7C:
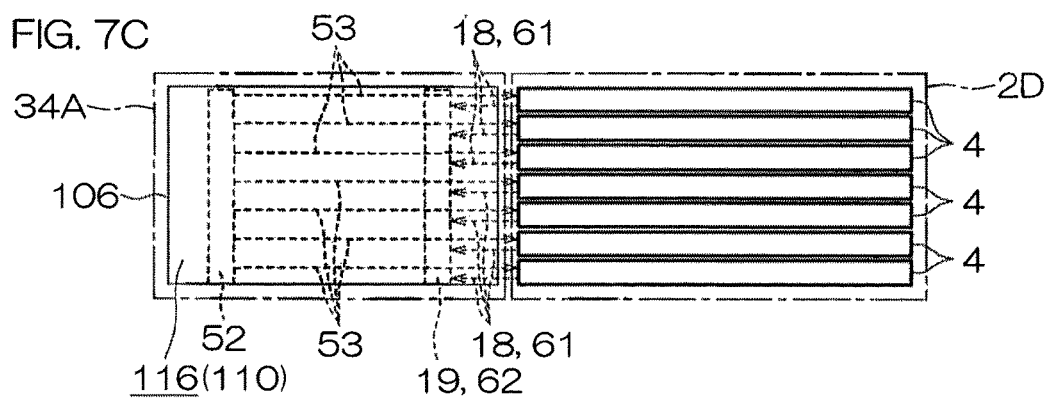
FIG. 7C is a view of FIG. 7A along cross-sectional line VIIC-VIIC.
Figure 7D:
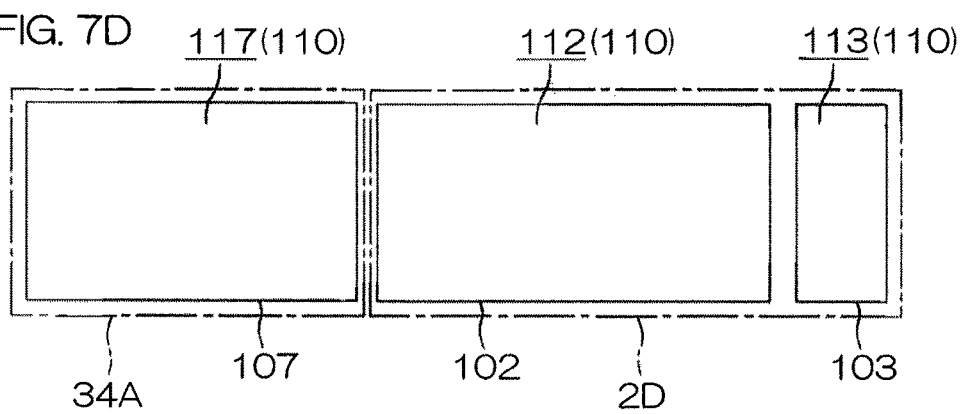
FIG. 7D is a view of FIG. 7A along cross-sectional line VIID-VIID.
Figure 7E:
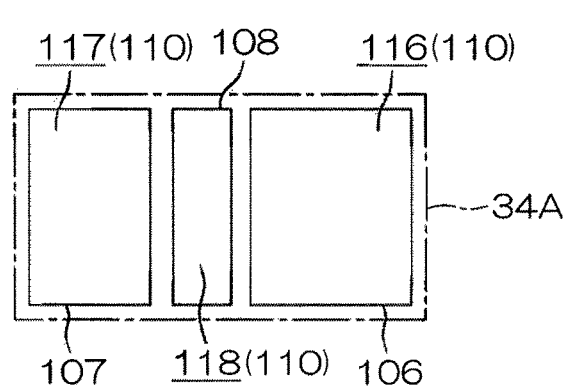
FIG. 7E is a view of FIG. 7A along cross-sectional line VIIE-VIIE.

FIG. 7A is a schematic diagram for describing the layout of the dry processing unit 2D and gas box 34A. FIG. 7B is a view of FIG. 7A along cross-sectional line VIIB-VIIB. FIG. 7C is a view of FIG. 7A along cross-sectional line VIIC-VIIC. FIG. 7D is a view of FIG. 7A along cross-sectional line VIID-VIID. FIG. 7E is a view of FIG. 7A along cross-sectional line VIIE-VIIE.

In the dry processing unit 2D, a first box 101 with a space in its interior is disposed between the plurality of baking chambers 4 and the transfer chamber 33. In this preferred embodiment, nothing is housed in the interior space of the first box 101. External air that has been taken up into the apparatus main body 31 circulates in the first box 101. The interior space of the first box 101 is provided in a manner communicating with the gas supply channel 16 (see FIG. 4), and thus external air that has been taken up into the apparatus main body 31 can be provided to the gas supply channel 16. The first box 101 is disposed in a manner covering essentially the entire region of the arrangement direction D2 side on the transfer chamber 33 side of the baking chamber 4 (the entire region except for the carry-out/carry-in port). The interior space of the first box 101 is an essentially sealed space with a high degree of sealability. The interior space of the first box 101 functions as a first isolating space 111 isolating the plurality of baking chambers 4 from the transfer chamber 33.

Specifically, the baking chamber 4 and the transfer chamber 33 are thermally isolated and atmosphere-shielded by the first isolating space 111. That is, even if ozone gas has flowed out from the partition wall 14 of the baking chamber 4, it is possible to block off, by the first isolating space 111, the ozone gas that has flowed out, it is thereby possible to reduce or prevent entry of the flowed ozone gas into the transfer chamber 33. Although an operator may enter or leave the transfer chamber 33 for maintenance, exposure of the operator to ozone gas can be prevented since ozone gas does not enter the transfer chamber 33.

In the dry processing unit 2D, a second box 102 with a space in its interior is disposed adjacent to the sides opposite from the transfer chamber 33 with respect to the plurality of baking chambers 4. In this preferred embodiment, nothing is housed in the interior space of the second box 102. The interior space of the second box 102 is an essentially sealed space with a high degree of sealability. The interior space of the second box 102 functions as a second isolating space 112 isolating the plurality of baking chambers 4 from the outer wall 35 of the apparatus main body 31.

The second box 102 may be provided in a detachable manner from outside the substrate processing apparatus 1. In this case, the heating unit 8, cooling unit 7 and the interior transfer unit 6 are also preferably provided in a movable manner along the horizontal direction that is perpendicular to the direction in which the transfer chamber 33 extends. In this case, by moving the units 8, 7, 6 along that direction with the second box 102 detached, it is possible to utilize the space left after detaching the second box 102, to remove out the units 8, 7, 6 from the interior of the baking chamber 4 and insert the units 8, 7, 6 into the baking chamber 4.

In the dry processing unit 2D, a third box 103 with a space in its interior is disposed adjacent to the wet processing unit 2W side with respect to the plurality of baking chambers 4 (right in FIG. 7A). In the interior space of the third box 103, there are housed electrical devices such as a unit controller 90 (see FIG. 6), an electrical equipment box 91 (see FIG. 6) and a gauge. The interior space of the third box 103 is an essentially sealed space with a high degree of sealability. The interior space of the third box 103 functions as a third isolating space (electrical device housing space) 113 isolating the plurality of baking chambers 4 from the wet processing unit 2W (see FIG. 1A).

Specifically, the baking chambers 4 and the wet processing unit 2W are thermally isolated and atmosphere-shielded by the third isolating space 113. The baking chambers 4 and wet processing unit 2W are thermally isolated. Consequently, it is possible to reduce or prevent heat from the baking chambers 4 from affecting wet processing in the wet processing unit 2W.

Furthermore, even if ozone gas has flowed out from the partition wall 14 of the baking chambers 4, it is possible to block off, by the third isolating space 113, the ozone gas that has flowed out, it is thereby possible to reduce or prevent entry of the flowed ozone gas into the wet chamber 9 of the wet processing unit 2W. Since a substrate W is inserted in and removed from the interior of the wet chamber 9, when ozone gas flows out into the wet chamber 9, the ozone gas may potentially flow out into the transfer chamber 33 through the interior of the wet chamber 9. Although an operator may enter or leave the transfer chamber 33 for maintenance, exposure of the operator to ozone gas can be prevented since ozone gas does not enter the transfer chamber 33.

Furthermore, the third isolating space 113 is disposed, with respect to the plurality of baking chambers 4, on the side opposite from fourth and fifth isolating spaces 116, 117 described below that house a piping through which ozone gas circulates in plan view. Consequently, even when ozone gas has flowed out from the piping in the interior spaces of the fourth and fifth isolating spaces 116, 117, it is virtually impossible for the flowed ozone gas to enter the third isolating space 113. For maintenance, an operator may enter or leave the third isolating space 113 in which the unit controller 90 (see FIG. 6) and electrical equipment box 91 (see FIG. 6) are housed, but exposure of the operator to ozone gas can be prevented since the ozone gas does not enter the third isolating space 113.

Each gas box 34A is provided with a first gas box 106, second gas box 107 and third gas box 108, aligned in the transverse direction. The first gas box 106, second gas box 107 and the third gas box 108 each have a space in the interior, and are mutually aligned in the transverse direction. The third gas box 108 is disposed adjacent to the load port LP side with respect to the plurality of baking chambers 4 (left in FIG. 7A).

The first gas box 106 is disposed adjacent to the load port LP side with respect to the plurality of baking chambers 4 and third gas box 108 (left in FIG. 7A). In the interior space of the first gas box 106, there extend vertically the converged exhaust piping 19, the converged ozone gas piping 52, the converged exhaust piping 62 and the nitrogen gas piping 58, etc. (see FIG. 4). The converged exhaust piping 19 and converged exhaust piping 62 are each connected to a respective baking chamber 4 via a respective individual exhaust piping 18 and a respective individual exhaust piping 61. The converged ozone gas piping 52 is connected to the respective baking chamber 4 via the respective individual gas supply piping 53. The interior space of the first gas box 106 is an essentially sealed space with a high degree of sealability. The interior space of the first gas box 106 functions as a fourth isolating space (piping housing space) 116 isolating the plurality of baking chambers 4 from the load port LP (see FIG. 1A).

Since the fourth isolating space 116 housing the converged exhaust piping 19, converged ozone gas piping 52 and the converged exhaust piping 62 is an essentially sealed space, even when ozone gas has flowed out from the pipings 19, 52, 62, it is possible to block off the ozone gas by the partition wall of the first gas box 106, thereby outflow of ozone gas into the indexer unit 32 can be effectively prevented. For maintenance, an operator may enter or leave the indexer unit 32, but exposure of the operator to ozone gas can be prevented since ozone gas does not enter the indexer unit 32.

The second gas box 107 is disposed adjacent to the load port LP side with respect to the plurality of baking chambers 4 and second box 102 (left in FIG. 7A). In the interior space of the second box 102, there are housed the ozone gas supply valve 54 (see FIG. 4), nitrogen gas supply valve 59 (see FIG. 4), first exhaust valve 66 (see FIG. 4), second exhaust valve 67 (see FIG. 4) and inert gas valve 78, etc., as well as sensors. Each individual gas supply piping 53 extends in the horizontal direction in the interior space of the second gas box 107. The interior space of the second gas box 107 is an essentially sealed space with a high degree of sealability. The interior space of the second gas box 107 functions as a fifth isolating space (piping housing space) 117 isolating the plurality of baking chambers 4 from the load port LP (see FIG. 1A).

Since the fifth isolating space 117 housing the individual exhaust piping 18, individual gas supply piping 53 and the individual exhaust piping 61 is an essentially sealed space, even when ozone gas has flowed out from the pipings 18, 53, 61, it is possible to block off the ozone gas by the partition wall of the second gas box 107, thereby outflow of ozone gas into the indexer unit 32 can be effectively prevented.

The interior space of the third gas box 108 is an essentially sealed space with a high degree of sealability. In the interior space of the third gas box 108, there is housed electrical wiring associated with supply of ozone gas. The interior space of the third gas box 108 functions as a sixth isolating space 118 isolating the plurality of baking chambers 4 from the load port LP (see FIG. 1A).

As shown in FIG. 7A, the first to third isolating spaces 111 to 113 and fourth to sixth isolating spaces 116 to 118 form an enclosing isolating space 110 that encloses the surrounding area of the plurality of baking chambers 4. The plurality of baking chambers 4 are thermally isolated from the members in the area surrounding the baking chambers 4, by the enclosing isolating space 110. The plurality of baking chambers 4 are also atmosphere-shielded from the members in the area surrounding the baking chambers 4, by the enclosing isolating space 110. Since the sides of the plurality of baking chambers 4 are enclosed by the enclosing isolating space 110, the heat and atmosphere from the baking chambers 4 are not even indirectly transmitted to the members in the area surrounding the baking chamber 4.

Furthermore, as mentioned above, the hot plate 21 is housed in the space partitioned by the hood 30 and base ring 27. Moreover, supply of ozone gas is also limited to only the space partitioned by the hood 30 and base ring 27, with supply of ozone gas only being permitted when the hood 30 is in the closed state. In other words, the hood 30 and base ring 27 positioned at the lower position function as an inner chamber 120 housed inside the baking chamber 4 (see FIG. 9F). In this state, the interior and exterior of the inner chamber 120 are thermally isolated and atmosphere-shielded.

Figure 8A:
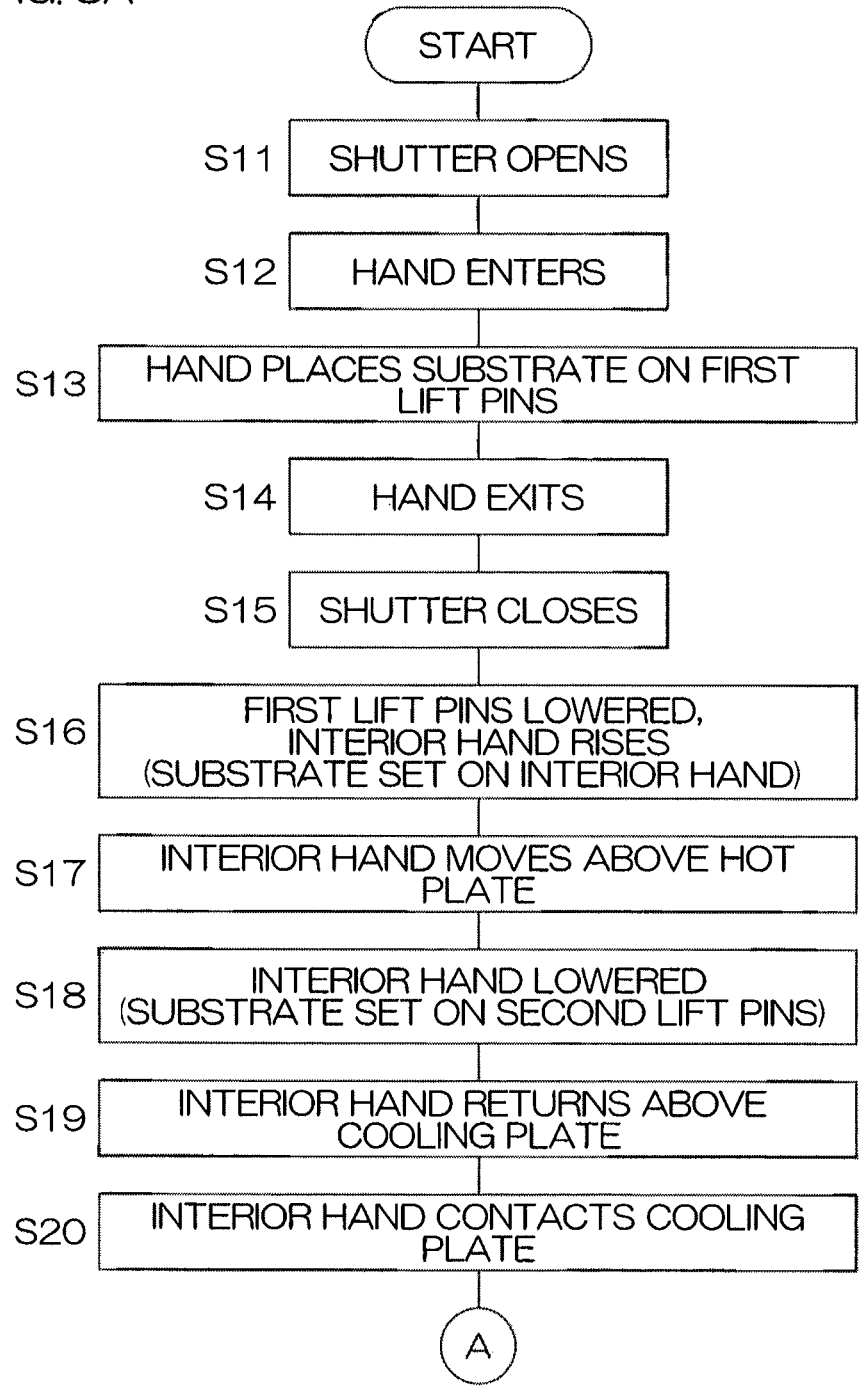
FIGS. 8A to 8C are flow charts showing an example of the dry processing illustrated in FIG. 2.
Figure 8B:
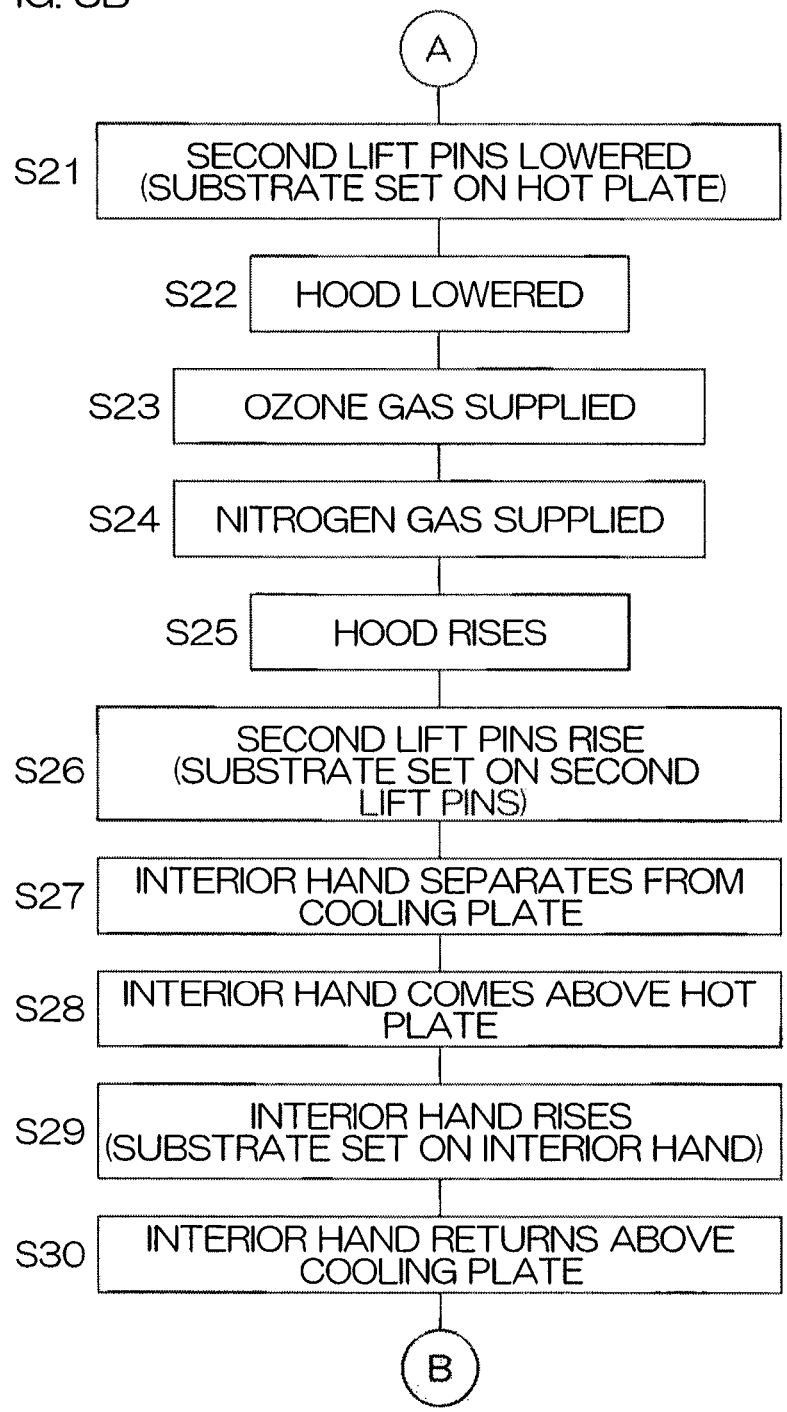
Figure 8C:
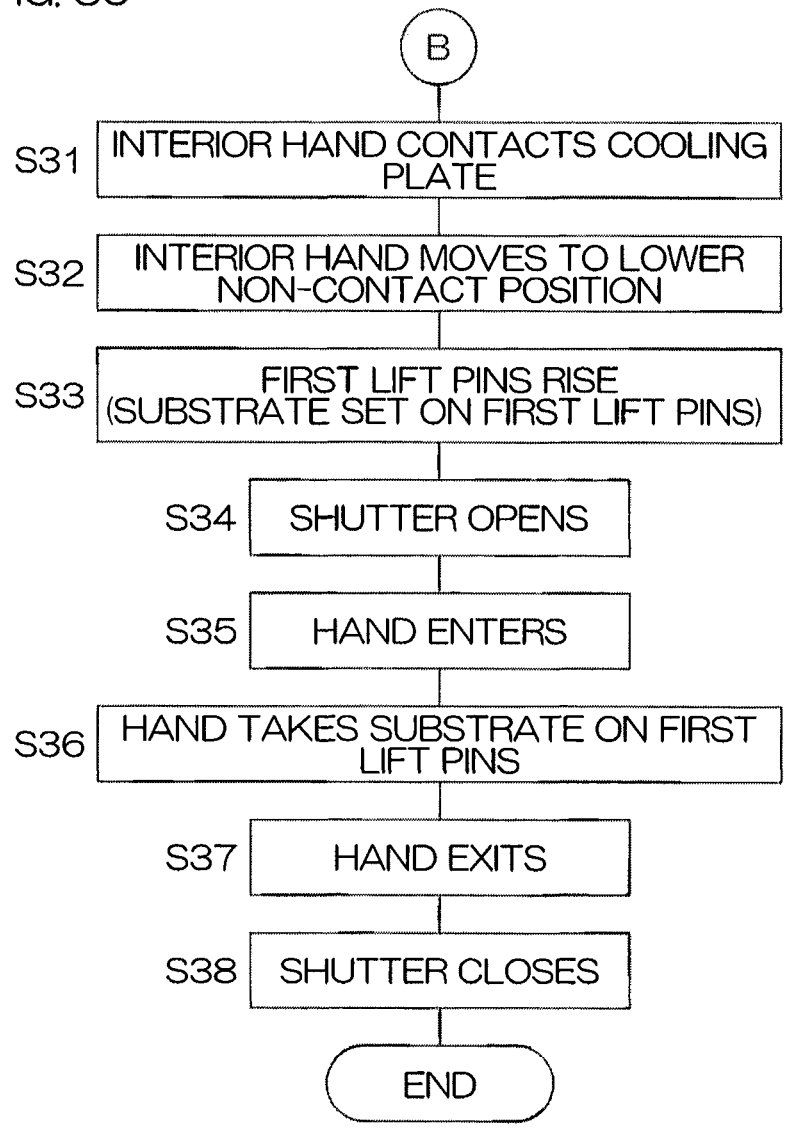

FIG. 8A to 8C are flow charts showing an example of the dry processing illustrated in FIG. 2. FIG. 9A to 9O are schematic views showing the state inside a baking chamber 4 when the dry processing illustrated in FIG. 2 is being carried out.

When a substrate W is carried into the dry processing unit 2D, a shutter opening/closing actuator 63 (see FIG. 9A) positions the shutter 5 at the open position, opening the carry-in/carry-out port of the baking chamber 4 (step S11 of FIG. 8A). Next, the center robot CR supports the substrate W, oriented with its front surface, i.e. device-forming surface, facing upward, with a hand H while inserting the hand H into the baking chamber 4 (step S12 of FIG. 8A).

Next, as shown in FIG. 9A, the center robot CR places the substrate W on the hand H onto the plurality of first lift pins 71 (step S13 of FIG. 8A), and moves the hand H out of the baking chamber 4 (step S14 of FIG. 8A). The shutter opening/closing actuator 63, after the hand H has retreated, moves the shutter 5 to the closed position, closing the carry-in/carry-out port of the baking chamber 4 (step S15 of FIG. 8A).

Figure 9B:
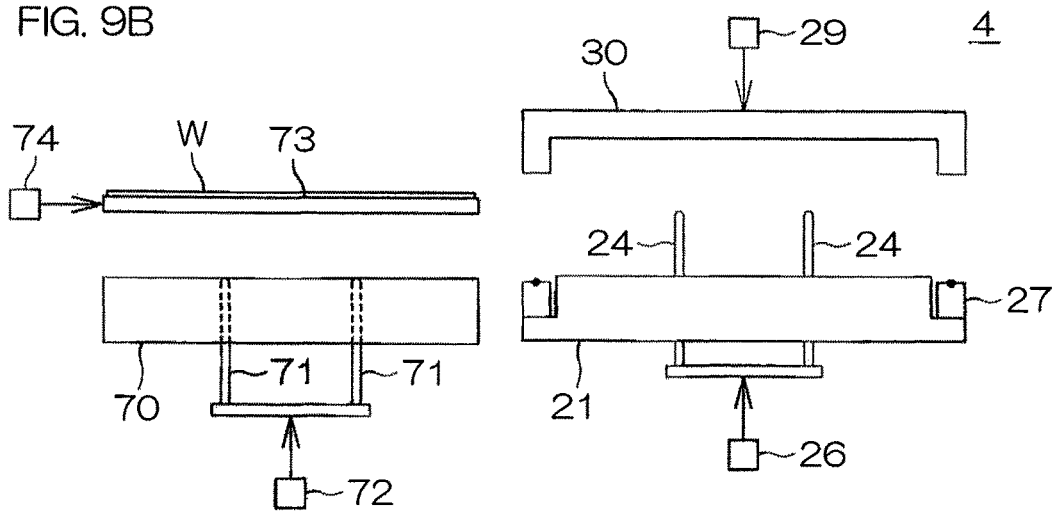

Next, as shown in FIG. 9B, with the substrate W in a state supported by the plurality of first lift pins 71, the first lift raising/lowering actuator 72 moves the plurality of first lift pins 71 from the upper position to the lower position (step S16 of FIG. 8A), and the hand moving mechanism 74 moves the interior hand 73 from the lower non-contact position to the upper non-contact position (step S16 of FIG. 8A). Thus, the substrate W separates from the plurality of first lift pins 71 and contacts the upper surface of the interior hand 73.

Figure 9C:
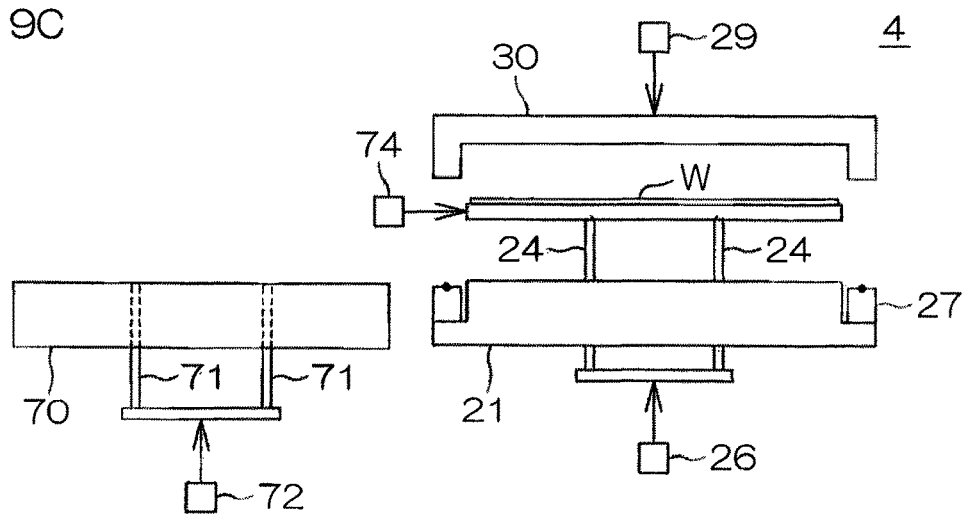
Figure 9D:
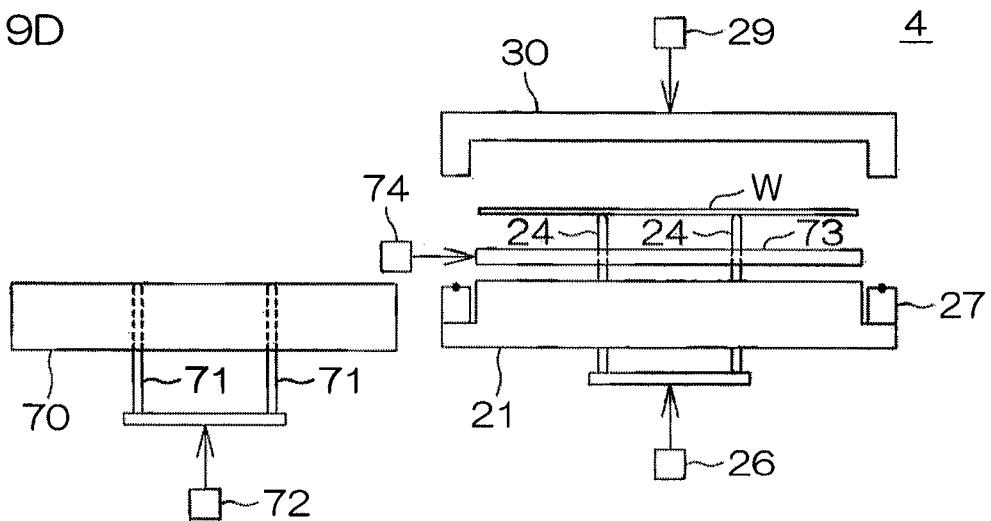

After the shutter 5 has been disposed at the closed position, the hood raising/lowering actuator 29 moves the hood 30 from the lower position to the upper position. After the hood 30 has been disposed at the upper position, the second lift raising/lowering actuator 26 moves the plurality of second lift pins 24 from the lower position to the upper position. As shown in FIG. 9C, with the plurality of second lift pins 24 in the state positioned at the upper position, the hand moving mechanism 74 inserts the interior hand 73, positioned at the upper non-contact position, between the hot plate 21 and the hood 30 (step S17 of FIG. 8A). Next, as shown in FIG. 9D, the hand moving mechanism 74 moves the interior hand 73 from the upper non-contact position to the lower non-contact position (step S18 of FIG. 8A). Thus, the substrate W separates from the upper surface of the interior hand 73 and contacts the plurality of second lift pins 24.

Figure 9E:
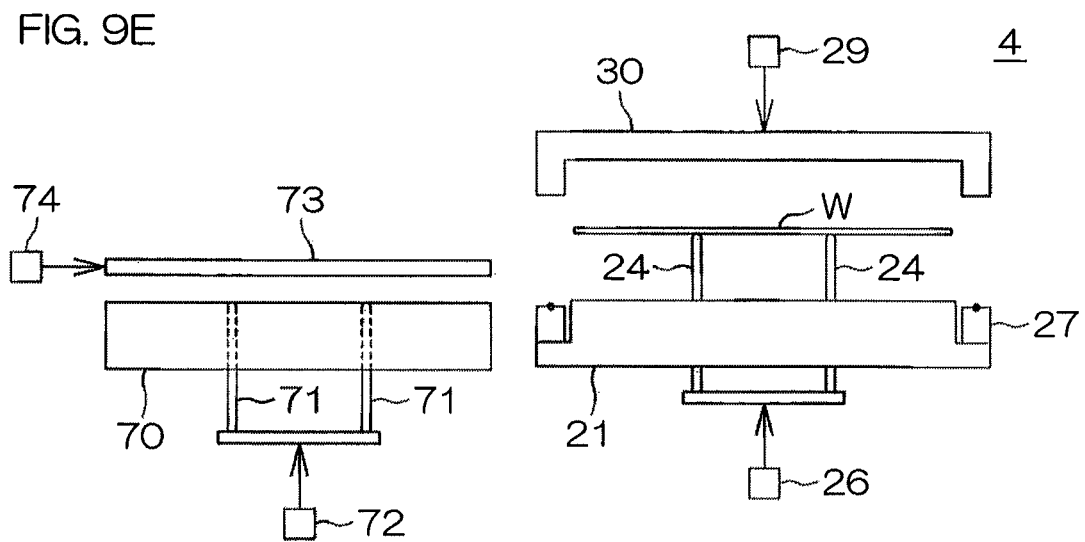
Figure 9F:
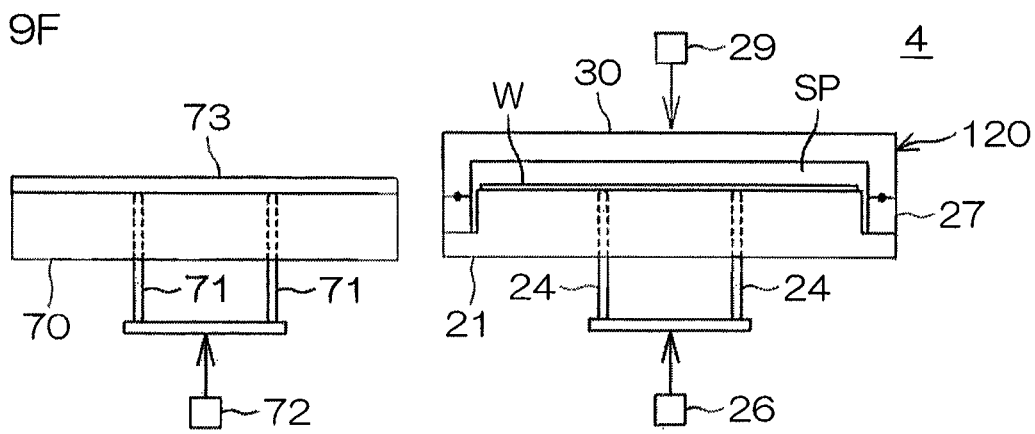

As shown in FIG. 9E, after having delivered the substrate W to the plurality of second lift pins 24, the hand moving mechanism 74 moves the interior hand 73 horizontally to move the interior hand 73 above the cooling plate 70 (step S19 of FIG. 8A). Next, as shown in FIG. 9F, the hand moving mechanism 74 lowers the interior hand 73 from the lower non-contact position to the contact position (step S20 of FIG. 8A). The lower surface of the interior hand 73 thus comes into contact with the upper surface of the cooling plate 70.

Next, as shown in FIG. 9F, the second lift raising/lowering actuator 26 moves the plurality of second lift pins 24 from the upper position to the lower position (step S21 of FIG. 8B). The substrate W thus separates from the plurality of second lift pins 24 and comes into contact with the upper surface of the hot plate 21, i.e. the plurality of protrusions 23a (see FIG. 4). After the plurality of second lift pins 24 have been moved to the lower position, the hood raising/lowering actuator 29 moves the hood 30 from the upper position to the lower position (step S22 of FIG. 8B). Thus, the gap between the hood 30 and the base ring 27 is sealed, forming the sealed space SP housing the substrate W. The hot plate 21 is kept at a heating temperature that is higher than room temperature (for example, a prescribed temperature of 100° C. or higher, such as 350° C.), even before the substrate W is supported by the hot plate 21. Heating of the substrate W is initiated when the substrate W is supported by the hot plate 21.

Figure 9G:
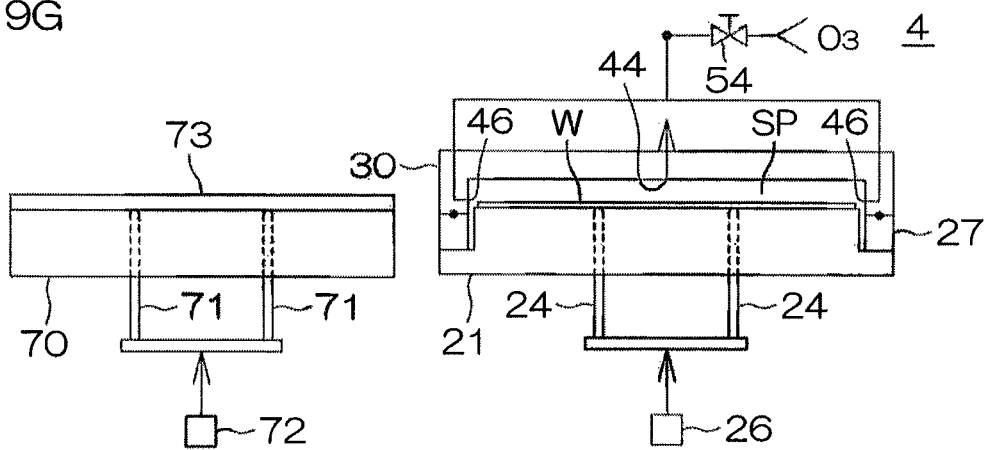

Next, as shown in FIG. 9G, the ozone gas supply valve 54 is opened and the plurality of gas supply ports 46 begin discharge of ozone gas (step S23 of FIG. 8B). The ozone gas flows from the plurality of gas supply ports 46 toward the center of the substrate W, along the upper surface of the substrate W. Thus, a plurality of gas streams are formed flowing from the outer perimeter of the upper surface of the substrate W toward the center of the upper surface of the substrate W. The air in the sealed space SP is guided to the exhaust port 44 by the ozone gas, and discharged out of the sealed space SP through the exhaust port 44. The sealed space SP thus becomes filled with ozone gas.

Figure 9H:
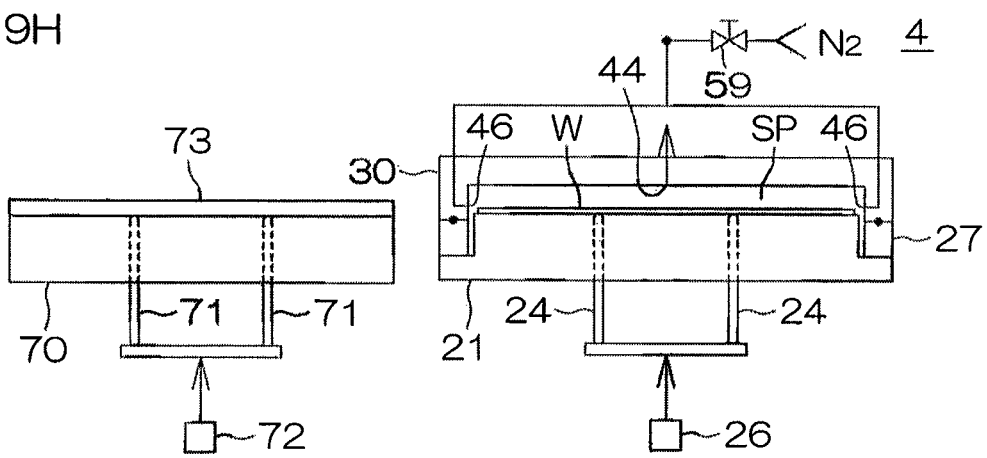

When a prescribed period of time has elapsed after the ozone gas supply valve 54 is opened, the ozone gas supply valve 54 is closed and discharge of ozone gas is interrupted. Next, as shown in FIG. 9H, the nitrogen gas supply valve 59 is opened and the plurality of gas supply ports 46 begin discharge of nitrogen gas (step S24 of FIG. 8B). The ozone gas in the sealed space SP is guided to the exhaust port 44 by the nitrogen gas, and discharged out of the sealed space SP through the exhaust port 44. The ozone gas in the sealed space SP is thus replaced with nitrogen gas. When a prescribed period of time has elapsed after the nitrogen gas supply valve 59 is opened, the nitrogen gas supply valve 59 is closed and discharge of nitrogen gas is interrupted.

Figure 9I:
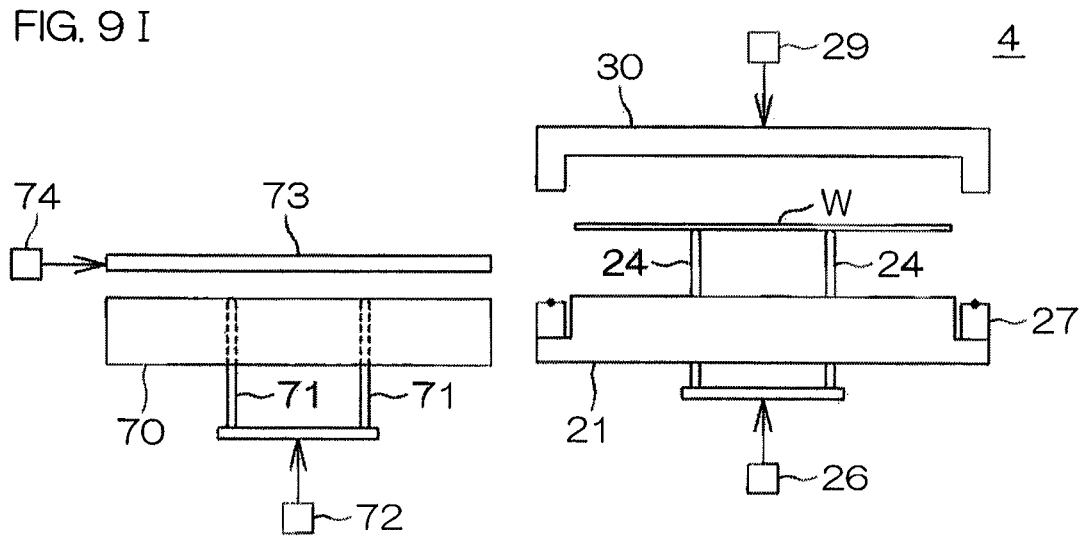

Next, as shown in FIG. 9I, the hood raising/lowering actuator 29 moves the hood 30 from the lower position to the upper position (step S25 of FIG. 8B). Next, the second lift raising/lowering actuator 26 moves the plurality of second lift pins 24 from the lower position to the upper position (step S26 of FIG. 8B). The substrate W thus separates from the upper surface of the hot plate 21 and comes into contact with the plurality of second lift pins 24.

As shown in FIG. 9I, the hand moving mechanism 74 raises the interior hand 73 that is positioned at the contact position, to the lower non-contact position (step S27 of FIG.

Figure 9J:
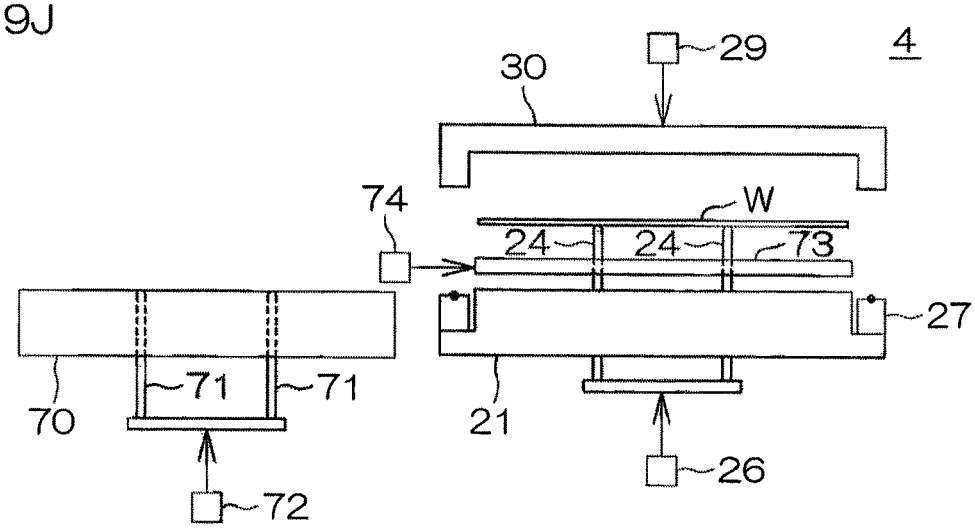
Figure 9K:
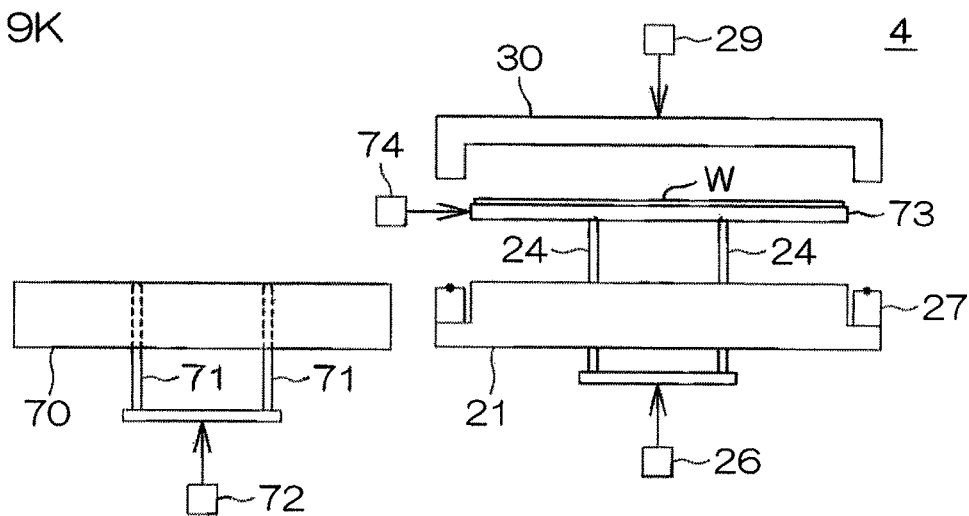

8B). Next, as shown in FIG. 9J, the hand moving mechanism 74 inserts the interior hand 73 between the hot plate 21 and the hood 30 (step S28 of FIG. 8B). Next, as shown in FIG. 9K, the hand moving mechanism 74 moves the interior hand 73 from the lower non-contact position to the upper non-contact position (step S29 of FIG. 8B). Thus, the substrate W separates from the plurality of second lift pins 24 and contacts the upper surface of the interior hand 73.

Figure 9L:
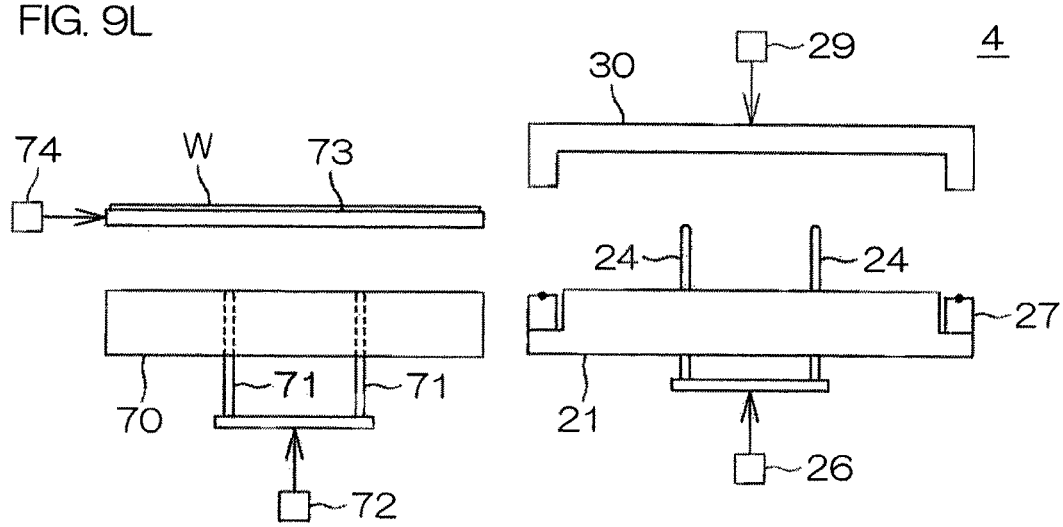
Figure 9M:
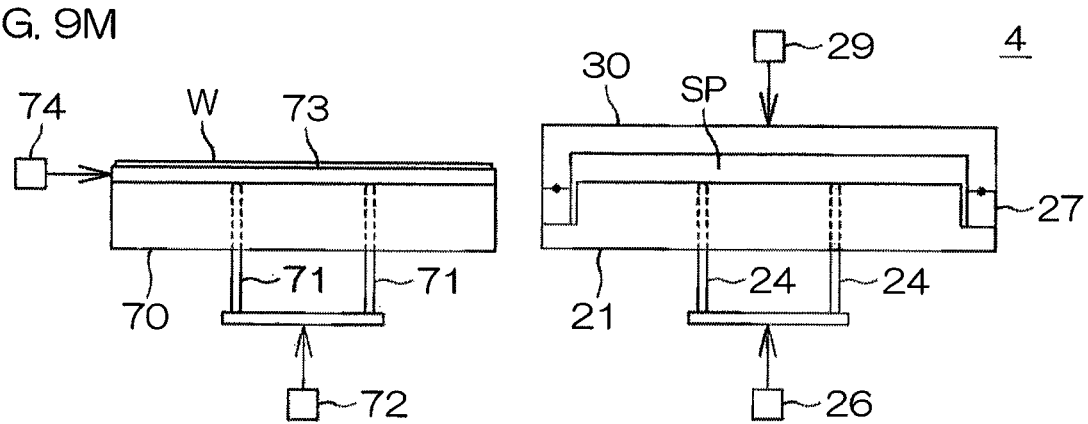

As shown in FIG. 9L, after the substrate W has been supported by the interior hand 73, the hand moving mechanism 74 positions the interior hand 73 at the upper non-contact position, while moving the interior hand 73 above the cooling plate 70 (step S30 of FIG. 8B). As shown in FIG. 9M, after the interior hand 73 has retreated between the hot plate 21 and the hood 30, the second lift raising/lowering actuator 26 moves the plurality of second lift pins 24 from the upper position to the lower position. The hood raising/lowering actuator 29 then moves the hood 30 from the upper position to the lower position.

Next, as shown in FIG. 9M, the hand moving mechanism 74 lowers the interior hand 73 from the upper non-contact position to the contact position (step S31 of FIG. 8C). The lower surface of the interior hand 73 thus comes into contact with the upper surface of the cooling plate 70. The cooling plate 70 is kept at a cooling temperature that is lower than the temperature (heating temperature) of the hot plate 21. The heat of the substrate W on the interior hand 73 is transmitted to the cooling plate 70 via the interior hand 73 that is in direct contact with the substrate W and the cooling plate 70. This causes the substrate W to be cooled.

Figure 9N:
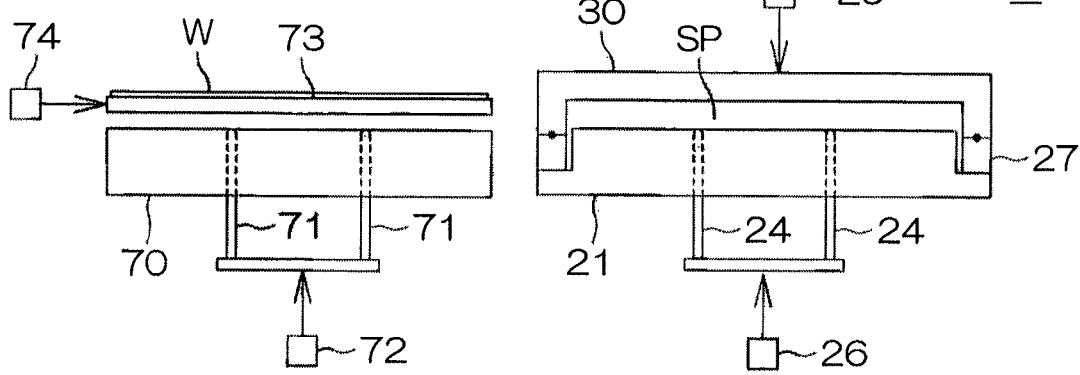
Figure 9O:
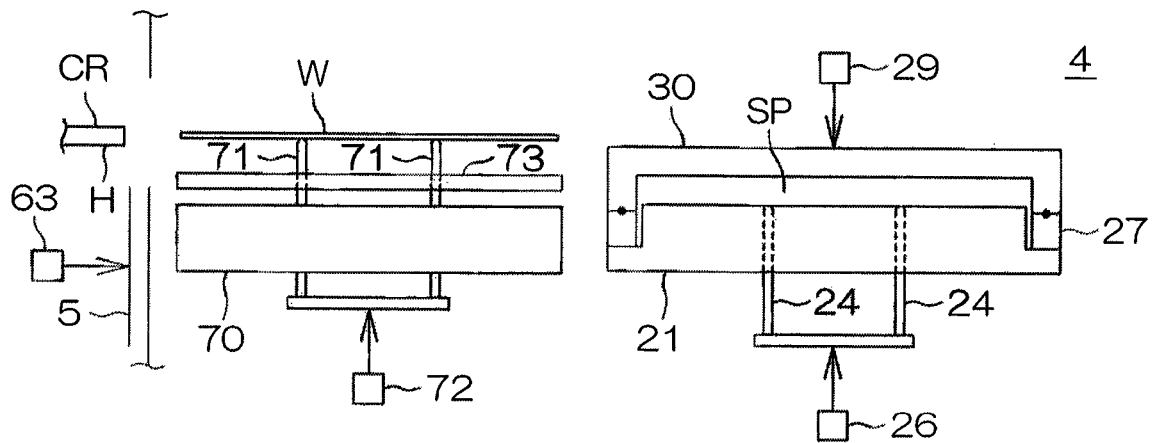

As shown in FIG. 9N, after a predetermined period has elapsed after the interior hand 73 has been disposed at the contact position, the hand moving mechanism 74 moves the interior hand 73 to the lower non-contact position (step S32 of FIG. 8C). Next, as shown in FIG. 9O, the first lift raising/lowering actuator 72 moves the plurality of first lift pins 71 from the lower position to the upper position (step S33 of FIG. 8C). Thus, the substrate W separates from the upper surface of the interior hand 73 and contacts the plurality of first lift pins 71.

Next, as shown in FIG. 9O, the shutter opening/closing actuator 63 moves the shutter 5 from the closed position to the open position, opening the carry-in/carry-out port of the baking chamber 4 (step S34 of FIG. 8C). The center robot CR then inserts the hand H into the baking chamber 4 (step S35 of FIG. 8C), and takes the substrate W on the plurality of first lift pins 71 with the hand H (step S36 of FIG. 8C). Next, the center robot CR supports the substrate W with the hand H, while moving the hand H out of the baking chamber 4 (step S37 of FIG. 8C). The shutter opening/closing actuator 63, after the hand H has retreated, moves the shutter 5 to the closed position (step S38 of FIG. 8C).

Thus, according to this preferred embodiment, the members in the area surrounding the baking chambers 4 are thermally isolated from the baking chambers 4 by the enclosing isolating space 110. Consequently, transmission of heat from the plurality of baking chambers 4 to the wet processing unit 2W or processing liquid supply device 100 is reduced or prevented, and therefore the effects of heat from the baking chambers 4 on wet processing at the wet processing unit 2W can be reduced or prevented. Thus, wet processing can be carried out in a state in which thermal effects from the baking chambers 4 have been eliminated, and therefore generation of processing irregularities in wet processing can be prevented.

The members in the area surrounding the baking chambers 4 are also atmosphere-shielded from the atmosphere in the baking chambers 4, by the enclosing isolating space 110. That is, even if ozone gas has flowed out from the baking chambers 4, it is possible to block off, by the enclosing isolating space 110, the ozone gas that has flowed out, it is thereby possible to reduce or prevent entry of the ozone gas that has flowed out, into the members in the surrounding area of the baking chambers 4.

In addition, since the sides of the plurality of baking chambers 4 are enclosed by the enclosing isolating space 110, the heat and atmosphere from the baking chambers 4 are not even indirectly transmitted to the members in the area surrounding the baking chamber 4. Consequently, it is possible to effectively reduce the effects of heat from the baking chambers 4 on wet processing at the wet processing unit 2W, and to effectively reduce entry of ozone gas into the members in the area surrounding the baking chambers 4.

In addition, the inner chamber 120 (see FIG. 9F) is disposed inside each baking chamber 4. By employing such a double chamber structure, it is possible to even more effectively reduce outflow of ozone gas out of the baking chamber 4 through the partition wall 14, thereby outflow of ozone gas out of the substrate processing apparatus 1 can be even more reliably prevented.

A preferred embodiment of the present invention has been described above, but the present invention may also be implemented in yet other embodiments.

For example, the preferred embodiment described above was described assuming that the heating unit 8 has the hot plate 21 enclosed by the inner chamber 120 (hood 30 and base ring 27 positioned at the lower position), but the hot plate 21 may be disposed in an exposed state in the baking chamber 4, without being enclosed by such an inner chamber.

Also, the explanation used as an example a configuration in which the heating unit 8 and cooling unit 7 are housed in the baking chamber 4, but the configuration may instead be such that only the heating unit 8 is housed in the baking chamber 4.

Furthermore, the processing liquid supply device 100 does not need to be disposed adjacent to the apparatus main body 31, and instead may be disposed at a position distant from the apparatus main body 31 on the same floor, or disposed on a different floor (for example, downstairs).

Also, the design may be such that the interior space of the second box 102 is in communication with the gas supply channel 16 (see FIG. 4) and external air that has been taken into the apparatus main body 31 circulates not only in the first box 101 but also in the second box 102.

Furthermore, the above explanation was for an example in which the number of dry processing unit 2D towers mounted in the substrate processing apparatus 1 was the same number as the number of wet processing unit 2W towers, but the number of dry processing unit 2D towers provided may be only a smaller number than the number of wet processing unit 2W towers. In addition, the number of dry processing units 2D included in each tower may also be modified as appropriate.

Also, the wet processing unit 2W was disposed on the side opposite from the load port LP with respect to the dry processing unit 2D in plan view, but instead of employing such a layout, and consequently, the wet processing unit 2W and dry processing unit 2D may be disposed in an adjacent manner. Even with such a layout, it is possible to satisfactorily thermally isolate the members in the area surrounding the baking chambers 4 from the baking chambers 4, by the enclosing isolating space 110 that encloses the sides of the stacked plurality of baking chambers 4.

Moreover, ozone gas was used as an example of processing gas to be used in the dry processing unit 2D, but the gas may be other processing gas instead. Other processing gas may be gas that affects the human body, e.g. fluorine gas such as $CF_4$, or $NH_3$.

The substrate processing apparatus 1 is not limited to being an apparatus that processes disk-shaped substrates W, and may instead be an apparatus that processes polygonal substrates W.

In addition, various design modifications may be employed that are within the scope of the description in the claims.

Although the preferred embodiments of the present invention is described in detail above, the preferred embodiment is merely specific examples used to clarify the technical content of the present invention. The present invention should not be interpreted as being limited only to these specific examples, and the scope of the present invention is limited only by the appended claims.

The present application corresponds to Japanese Patent Application No. 2016-187251 filed on Sep. 26, 2016 in the Japan Patent Office, and the entire disclosure of this application is incorporated herein by reference.

What is claimed is:

1. A substrate processing apparatus comprising:
a plurality of baking chambers stacked in a prescribed direction, and in each of the baking chambers, a heater arranged so as to heat a substrate therein, and a box-shaped partition wall that surrounds the heater and provided with a carry-in/carry-out port through which the substrate passes to carry-in or carry-out;
a processing unit having a liquid processing chamber separate from the baking chambers and carrying out liquid processing of the substrate using a processing liquid; and
an enclosing isolating space that encloses sides of the partition walls of the plurality of baking chambers and isolates the baking chambers from a surrounding area, wherein a plurality hollow boxes are provided such that respective internal spaces of the plurality of hollow boxes form the enclosing isolating space that surrounds the sides of the partition walls of the baking chambers entirely when viewed in plan view except a region opposing to the carry-in/carry-out port.

2. The substrate processing apparatus according to claim 1, wherein the baking chambers each include a chamber that supplies processing gas to the substrate while heating the substrate.

3. The substrate processing apparatus according to claim 1, further comprising:
a container holder that holds a container for housing of the substrate, wherein
the liquid processing chamber being disposed on a side opposite from the container holder with respect to the baking chambers.

4. The substrate processing apparatus according to claim 3, further comprising:
a transfer chamber for transfer of the substrate being held by the container holder, to the baking chambers and the liquid processing chamber, wherein
the enclosing isolating space including a first isolating space provided between the baking chambers and the transfer chamber.

5. The substrate processing apparatus according to claim 3, wherein the enclosing isolating space includes a second isolating space provided between the baking chambers and an outer wall of the substrate processing apparatus.

6. The substrate processing apparatus according to claim 3, wherein the enclosing isolating space includes a third isolating space provided between the baking chambers and the liquid processing chamber.

7. The substrate processing apparatus according to claim 1, wherein
each of the baking chambers includes in its interior a chamber that supplies processing gas to the substrate while heating the substrate,
the enclosing isolating space includes:
a piping housing space that houses an exhaust piping through which exhaust circulates from the baking chambers and/or a processing gas supply piping, that supplies processing gas to the baking chambers, and
an electrical device housing space that houses electrical devices associated with the baking chambers, and
the electrical device housing space is disposed on a side opposite from the piping housing space with respect to the baking chambers.

8. The substrate processing apparatus according to claim 1, wherein, inside each of the baking chambers, there is housed an inner chamber that supplies processing gas to the substrate while heating the substrate therein.

* * * * *